US009905753B2

United States Patent
Lee et al.

(10) Patent No.: US 9,905,753 B2
(45) Date of Patent: Feb. 27, 2018

(54) FREE LAYER, MAGNETORESISTIVE CELL, AND MAGNETORESISTIVE RANDOM ACCESS MEMORY DEVICE HAVING LOW BORON CONCENTRATION REGION AND HIGH BORON CONCENTRATION REGION, AND METHODS OF FABRICATING THE SAME

(71) Applicants: Joonmyoung Lee, Anyang-si (KR); Youngman Jang, Hwaseong-si (KR); Kiwoong Kim, Hwaseong-si (KR); Yongsung Park, Suwon-si (KR)

(72) Inventors: Joonmyoung Lee, Anyang-si (KR); Youngman Jang, Hwaseong-si (KR); Kiwoong Kim, Hwaseong-si (KR); Yongsung Park, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/157,399

(22) Filed: May 17, 2016

(65) Prior Publication Data

US 2017/0084829 A1 Mar. 23, 2017

(51) Int. Cl.

| H01L 43/12 | (2006.01) |
|---|---|
| H01L 43/08 | (2006.01) |
| G11C 11/16 | (2006.01) |
| H01L 43/10 | (2006.01) |
| H01L 27/22 | (2006.01) |

(52) U.S. Cl.
CPC ............ *H01L 43/12* (2013.01); *G11C 11/161* (2013.01); *H01L 43/08* (2013.01); *H01L 43/10* (2013.01); *H01L 27/228* (2013.01)

(58) Field of Classification Search
CPC ...... H01L 27/222–27/228; H01L 43/00; H01L 43/08; H01L 43/12; G11C 11/15
See application file for complete search history.

(56) References Cited

U.S. PATENT DOCUMENTS

| 8,456,898 B2 | 6/2013 | Chen et al. |
| 8,728,830 B2 | 5/2014 | Nishimura |
| 8,786,036 B2 | 7/2014 | Cao et al. |

(Continued)

FOREIGN PATENT DOCUMENTS

JP 2010080496 A 4/2010

*Primary Examiner* — Julia Slutsker
(74) *Attorney, Agent, or Firm* — Renaissance IP Law Group LLP

(57) ABSTRACT

A method of forming a magnetoresistive memory device includes forming a ferromagnetic layer, forming a tunneling barrier layer on the ferromagnetic layer, forming a first preliminary free magnetic layer (free layer) containing boron (B) on the tunneling barrier layer, forming a first buffer layer on the first preliminary free layer, performing a first annealing process to transition the first preliminary free layer to form a second preliminary free layer and the first buffer layer to form a first boride layer, performing an etching process to remove the first boride layer, forming a second buffer layer on the second preliminary free layer, performing a second annealing process to transition the second preliminary free layer to form a free layer and the second buffer layer to form a second boride layer, and performing an oxidation process to transition the second boride layer to an oxide layer.

20 Claims, 16 Drawing Sheets

(56) References Cited

U.S. PATENT DOCUMENTS

| | | |
|---|---|---|
| 8,790,798 B2 | 7/2014 | Shukh |
| 8,980,650 B2 | 3/2015 | Oguz et al. |
| 9,028,910 B2 | 5/2015 | Zhou et al. |
| 2014/0110804 A1 | 4/2014 | Han et al. |
| 2014/0291663 A1 | 10/2014 | Kuo et al. |
| 2016/0111632 A1* | 4/2016 | Sandhu ................ H01L 27/222 257/421 |

* cited by examiner (A)

(B)

(A)

(B)

FREE LAYER, MAGNETORESISTIVE CELL, AND MAGNETORESISTIVE RANDOM ACCESS MEMORY DEVICE HAVING LOW BORON CONCENTRATION REGION AND HIGH BORON CONCENTRATION REGION, AND METHODS OF FABRICATING THE SAME

CROSS-REFERENCE TO RELATED APPLICATION

This application claims priority under 35 U.S.C. § 119 to Korean Patent Application No. 10-2015-0131836 filed on Sep. 17, 2015, the disclosure of which is hereby incorporated by reference in its entirety.

BACKGROUND

Embodiments disclosed herein relate to a magnetoresistive memory device, and, more specifically, a free layer, a magnetoresistive cell, and a magnetoresistive memory device including a region having a relatively low concentration of boron (B) and a region having a relatively high concentration of boron (B), and methods of fabricating the same.

DESCRIPTION OF RELATED ART

Magnetoresistive random access memory (MRAM) devices, in particular, spin transfer torque MRAM (STT-MRAM) devices, are being spotlighted as a next-generation memory to replace dynamic random access memory (DRAM) devices because MRAM devices are operated at a low current level, enable random access, and have non-volatile characteristics. Present technical challenges associated with the MRAM devices include preserving data for a long time and reducing power consumption. It is known that retention characteristics for preserving data for a long time become better as a magnetization direction of a free magnetic layer (free layer) is verticalized, or made more vertical. However, in order to reduce power consumption, it is advantageous for the magnetization direction of the free layer to be horizontal to so that the direction of the magnetization of the free layer changes, or switches, at a low current level. The magnetization direction of the free layer may be changed based on a concentration of boron (B) in the free layer. According to various embodiments of the subject matter disclosed herein, the free layer may include regions having different concentrations of boron (B). Accordingly, data retention characteristics may be improved, and power consumption may be reduced.

SUMMARY

Embodiments disclosed herein provide a free layer including a region having a relatively low concentration of boron (B) and a region having a relatively high concentration of boron (B), and a magnetoresistive cell having the free layer and a magnetoresistive memory device having the free layer.

Embodiments disclosed herein provide a free layer including a substantially boron-free region and a boron-containing region, and a magnetoresistive cell having the free layer and a magnetoresistive memory device having the free layer.

Embodiments disclosed herein provide methods of fabricating a free layer including a region having a relatively low concentration of boron (B) and a region having a relatively high concentration of boron (B), and methods of fabricating a magnetoresistive cell having the free layer and fabricating a magnetoresistive memory device having the free layer.

Embodiments disclosed herein provide methods of fabricating a free layer including a substantially boron-free region and a boron-containing region, and methods of fabricating a magnetoresistive cell having the free layer, and fabricating a magnetoresistive memory device having the free layer.

Embodiments disclosed herein provide methods of fabricating a free layer having a gradated concentration of boron (B), and methods of fabricating a magnetoresistive cell having the free layer, and fabricating a magnetoresistive memory device having the free layer.

The technical features of the embodiments disclosed herein are not limited to the above disclosure; other features and advantages may become apparent to those of ordinary skill in the art based on the following descriptions.

In accordance with an aspect of the subject matter disclosed herein, a method of forming a magnetoresistive memory device includes forming a magnetic layer, forming a tunneling barrier layer on the magnetic layer, forming a first preliminary free magnetic layer (free layer) containing boron (B) on the tunneling barrier layer, forming a first buffer layer on the first preliminary free layer, performing a first annealing process to transition the first preliminary free layer to form a second preliminary free layer and the first buffer layer to form a first boride layer, performing an etching process to remove the first boride layer, forming a second buffer layer on the second preliminary free layer, performing a second annealing process to transition the second preliminary free layer to form a free layer and the second buffer layer to form a second boride layer, and performing an oxidation process to transition the second boride layer to an oxide layer.

In accordance with another aspect of the subject matter disclosed herein, a method of forming a magnetoresistive memory device includes forming a magnetic layer, forming a tunneling barrier layer on the magnetic layer, forming a first preliminary free magnetic layer (free layer) containing boron (B) on the tunneling barrier layer, forming a first buffer layer on the first preliminary free layer, performing a first annealing process to transition the first preliminary free layer to form a second preliminary free layer and the first buffer layer to form a first boride layer, performing a first etching process to remove the first boride layer, forming a second buffer layer on the second preliminary free layer, performing a second annealing process to transition the second preliminary free layer to form a free layer and the second buffer layer to form a second boride layer, performing a second etching process to remove the second boride layer, and forming an oxide layer on the free layer.

In accordance with still another aspect of the subject matter disclosed herein, a magnetoresistive memory device includes a magnetoresistive cell disposed on a lower electrode and an upper electrode disposed on the magnetoresistive cell. The magnetoresistive cell includes a magnetic layer, a tunneling barrier layer disposed on the magnetic layer, a free magnetic layer (free layer) disposed on the tunneling barrier layer, an oxide layer disposed on the free layer, and a capping layer disposed on the oxide layer. The free layer includes a first region having a relatively low concentration of boron (B) and disposed to be close to the tunneling barrier layer and a second region having a relatively high concentration of boron (B) and disposed to be far from the tunneling barrier layer.

In accordance with still another aspect of the subject matter disclosed herein, a magnetoresistive memory device includes a magnetoresistive cell disposed on a lower electrode, and an upper electrode disposed on the magnetoresistive cell. The magnetoresistive cell includes a magnetic layer, a tunneling barrier layer disposed on the magnetic layer, a free magnetic layer (free layer) disposed on the tunneling barrier layer, an oxide layer including boron (B) and disposed on the free layer, and a capping layer disposed on the oxide layer. The free layer has a gradually gradated concentration of boron (B) from a lower portion having a relatively low concentration of boron (B) to an upper portion having a relatively high concentration of boron (B).

In accordance with an aspect of the subject matter disclosed herein, a magnetoresistive memory cell comprises: a ferromagnetic layer in which the ferromagnetic layer comprises a first surface and a second surface that is opposite the first surface of the ferromagnetic layer; a tunnel barrier layer on the ferromagnetic layer in which the tunnel barrier comprises a first surface and a second surface that is opposite the first surface of the tunnel barrier layer and in which the first surface of the tunnel barrier layer is proximate to the second surface of the ferromagnetic layer; and a free magnetic layer on the tunnel barrier layer in which the free magnetic layer comprises a first surface and a second surface that is opposite the first surface of the free magnetic layer, in which the first surface of the free magnetic layer is proximate to the second surface of the tunnel barrier layer, in which the free magnetic layer further comprises a first region that is proximate to the second surface of the tunnel barrier layer and a second region that is distal to the second surface of the tunnel barrier layer, and in which the first region comprises a concentration of boron that is less that a concentration of boron of the second region.

In accordance with an aspect of the subject matter disclosed herein, a method of forming a magnetoresistive memory device comprises: forming a ferromagnetic layer in which the ferromagnetic layer comprising a first surface and a second surface that is opposite the first surface of the ferromagnetic layer; forming a tunnel barrier layer on the ferromagnetic layer in which the tunnel barrier comprises a first surface and a second surface that is opposite the first surface of the tunnel barrier layer, in which the first surface of the tunnel barrier layer is proximate to the second surface of the ferromagnetic layer; and forming a free magnetic layer on the tunnel barrier layer in which the free magnetic layer comprises a first surface and a second surface that is opposite the first surface of the free magnetic layer, in which the first surface of the free magnetic layer is proximate to the second surface of the tunnel barrier layer, the free magnetic layer further comprises a first region that is proximate to the second surface of the tunnel barrier layer and a second region that is distal to the second surface of the tunnel barrier layer, and in which the first region comprises a concentration of boron that is less that a concentration of boron of the second region.

Details of other embodiments are included in the detailed description and drawings.

BRIEF DESCRIPTION OF THE DRAWINGS

The foregoing and other features and advantages of the subject matter disclosed herein will be apparent from the more particular description of example embodiments, as illustrated in the accompanying drawings in which like reference numerals denote the same respective parts throughout the different views. The drawings are not necessarily to scale, emphasis instead being placed upon illustrating the principles of the subject matter disclosed herein. In the drawings.

DETAILED DESCRIPTION OF THE EMBODIMENTS

Figure 1:
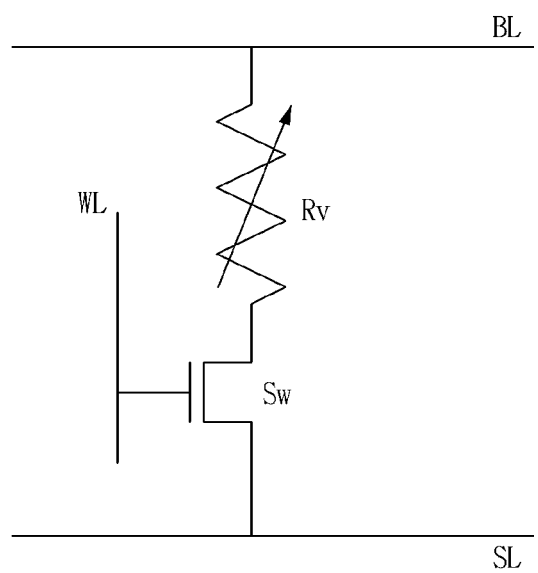
FIG. 1 is an equivalent circuit diagram of a unit cell of a magnetoresistive random access memory (MRAM) in accordance with the subject matter disclosed herein.

Various embodiments will now be described more fully with reference to the accompanying drawings in which some embodiments are shown. The subject matter disclosed herein may, however, be embodied in different forms and should not be construed as limited to the embodiments set forth herein. Rather, these embodiments are disclosed so that this disclosure is thorough and complete and fully conveys the subject matter disclosed herein to those skilled in the art. Accordingly, all such modifications are intended to be included within the scope of the claimed subject matter.

The terminology used herein to describe the disclosed embodiments is not intended to limit the scope of the claimed subject matter. The use herein of a singular form should not preclude the presence of more than one referent. In other words, elements of the disclosed embodiments referred to in the singular form may number one or more, unless the context clearly indicates otherwise. It shall be further understood that the terms "comprises," "comprising," "includes," and/or "including," when used herein, specify the presence of stated elements, components, steps, operations, and/or devices, but do not preclude the presence or addition of one or more other elements, components, steps, operations, and/or devices.

Spatially relative terms, such as "beneath," "below," "lower," "above," "upper," and the like may be used herein to describe the relationship of one element or feature to another, as illustrated in the drawings. It shall be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below depending upon overall device orientation. Additionally, references to a direction that is referred to a vertical direction may refer to a direction in a figure that is parallel or substantially parallel to a direction from the bottom of the figure to the top of the figure. Similarly, references to a direction that is referred to a horizontal direction may refer to a direction in a figure that is parallel or substantially parallel to a direction from left to right in the figure.

Embodiments are described herein with reference to cross-sectional views and/or planar views that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein, but are to include deviations in shapes that result, for example, from manufacturing variations. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of the claimed subject matter.

Like numerals refer to like elements throughout the specification. Accordingly, the same numerals and similar numerals may be described with reference to other drawings, even if not specifically described in a corresponding drawing. Further, when a numeral is not marked in a drawing, the numeral may be described with reference to other drawings.

FIG. 1 is an equivalent circuit diagram of a unit cell of a magnetoresistive random access memory (MRAM) in accordance with an embodiment of the subject matter disclosed herein. Referring to FIG. 1, an MRAM in accordance with an embodiment may include a source line SL, a switching device Sw, a word line WL, a variable resistor Rv, and a bit line BL. The switching device Sw may include a transistor. When a voltage is applied to the word line WL to turn the switching device Sw on, a current may be supplied to the bit line BL from the source line SL via the variable resistor Rv. Based on a resistance value of the variable resistor Rv, the amount of current supplied to the bit line BL may change. Here, the amount of current may indicate a logic "1" or a logic "0". The variable resistor Rv, for example, a magnetoresistive cell, may have either a high resistance state or a low resistance state based on the amount of current supplied from the source line SL.

Figure 2A:
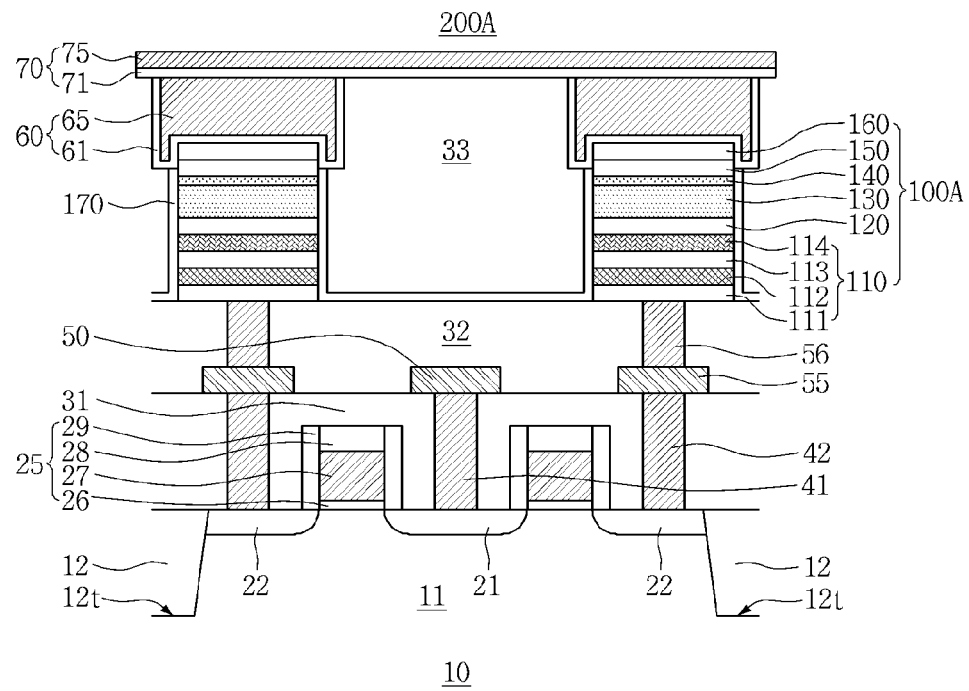
FIGS. 2A and 2B are vertical cross-sectional views schematically illustrating MRAM devices 200A and 200B in accordance with embodiments disclosed herein.
Figure 2B:
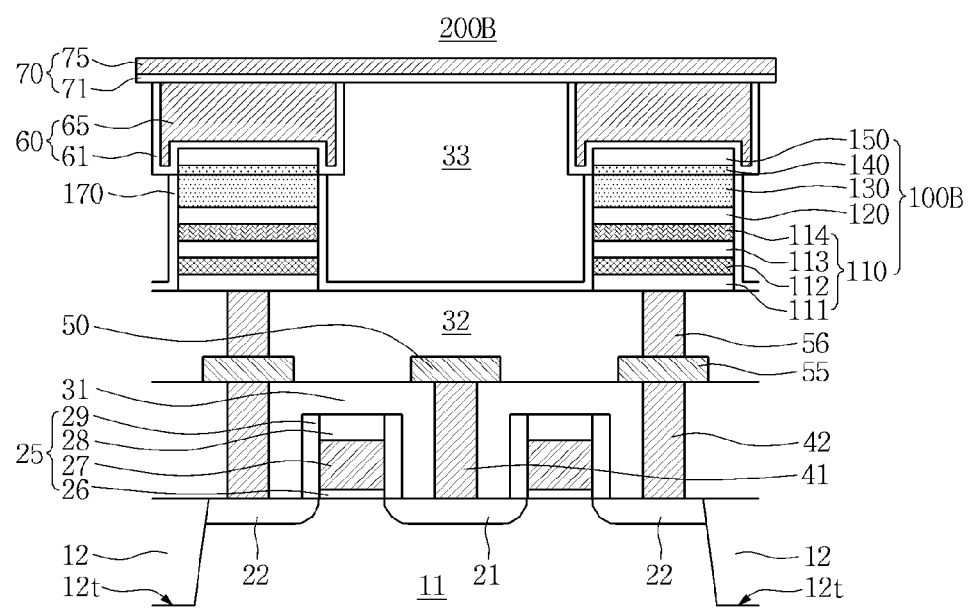

FIGS. 2A and 2B respectively are vertical cross-sectional views schematically illustrating MRAMs 200A and 200B in accordance with embodiments disclosed herein. Referring to FIG. 2A, the MRAM 200A in accordance with an embodiment may include an isolation region 12 defining an active region 11 in a substrate 10, a gate structure 25 formed on the active region 11 of the substrate 10, a source interconnection 50, a lower electrode 56, a magnetoresistive cell 100A, an upper electrode 60, and a bit line 70.

The gate structure 25 may include a gate insulating layer 26 formed directly on a surface of the active region 11, a gate electrode 27 disposed on the gate insulating layer 26, a gate capping layer 28 disposed on the gate electrode 27, and gate spacers 29 formed on side surfaces of the gate insulating layer 26, the gate electrode 27 and the gate capping layer 28. The gate insulating layer 26 may include silicon oxide ($SiO_2$) or a metal oxide, such as, but not limited to, hafnium oxide (HfO). The gate electrode 27 may include a conductive material, such as silicon, a metal, a metal alloy and/or a metal silicide. The gate capping layer 28 may include an insulating material, such as silicon nitride (SiN), that is denser and more solid than silicon oxide ($SiO_2$). The gate spacers 29 may include silicon nitride (SiN), silicon boron nitride (SiBN), and/or silicon carbon nitride (SiCN).

A source area 21 and a drain area 22 may be disposed in the substrate 10 at both sides of the gate structure 25. The source area 21 and the drain area 22 may include a dopant, such as boron (B), phosphorous (P), and/or arsenic (As), to have conductivity.

The MRAM 200A may further include a lower interlayer insulating layer 31 covering the gate structure 25. The lower interlayer insulating layer 31 may include silicon oxide ($SiO_2$). The structure formed by the gate structure 25, the source area 21 and the drain area 22 may correspond to the switching device Sw depicted in FIG. 1.

The MRAM 200A may further include a source contact plug 41 connected to the source area 21 by passing vertically through the lower interlayer insulating layer 31 and a drain contact plug 42 connected to the drain area 22 by passing vertically through the lower interlayer insulating layer 31. The source contact plug 41 and the drain contact plug 42 may include a conductive material, such as silicon, a metal, a metal alloy, and/or a metal silicide. The source contact plug 41 and the drain contact plug 42 may have substantially pillar shapes. Upper surfaces of the lower interlayer insulating layer 31, the source contact plug 41, and the drain contact plug 42 may be coplanar or substantially coplanar.

The source interconnection 50 may be disposed on the source contact plug 41 and the lower interlayer insulating layer 31. The source interconnection 50 may extend substantially horizontally and may substantially have a line shape in a top view. The source interconnection 50 may include a conductive material, such as silicon, a metal, a metal alloy, and/or a metal silicide.

The MRAM 200A may further include a lower electrode pad 55 disposed on the drain contact plug 42. The lower electrode pad 55 may have substantially a circular, a tetragonal, or a polygonal shape in a top view. The lower electrode pad 55 may be disposed at substantially the same level as the source interconnection 50. The lower electrode pad 55 may also include a conductive material, such as silicon, a metal, a metal alloy, and/or a metal silicide. The lower electrode pad 55 may include substantially the same material as the source interconnection 50.

The MRAM 200A may further include an intermediate interlayer insulating layer 32 covering the source interconnection 50 and the lower electrode pad 55. The intermediate interlayer insulating layer 32 may include silicon oxide ($SiO_2$) and/or silicon nitride (SiN).

The lower electrode 56 may be connected to the lower electrode pad 55 by passing in a vertical direction through the intermediate interlayer insulating layer 32. The lower electrode 56 may have substantially a pillar shape. The lower electrode 56 may include a conductive material, such as silicon, a metal, a metal alloy, and/or a metal silicide.

The magnetoresistive cell 100A may be disposed on the lower electrode 56 and the intermediate interlayer insulating layer 32. The magnetoresistive cell 100A may include a ferromagnetic layer 110, a tunneling barrier layer 120, a free magnetic layer (free layer) 130, an oxide layer 140, a capping layer 150 and a hardmask 160. In other embodiments, one of the capping layer 150 or the hardmask 160 may be omitted.

The ferromagnetic layer 110 may include a seed layer 111, a pinning layer 112, a synthetic anti-ferromagnetic (SAF) layer 113 and a pinned layer 114.

The seed layer 111 may provide crystallinity or a crystal orientation for the pinning layer 112. The seed layer 111 may include a tantalum (Ta) layer and/or a ruthenium (Ru) layer. For example, the seed layer 111 may be formed as a double layer that includes a lower tantalum (Ta) layer and an upper ruthenium (Ru) layer disposed on the lower tantalum (Ta) layer. Alternatively, the seed layer 111 may be formed of only a tantalum (Ta) layer or a ruthenium (Ru) layer. The pinning layer 112 may include a cobalt platinum (CoPt) or cobalt palladium (CoPd) based alloy, or a laminate of cobalt platinum (CoPt) and cobalt palladium (CoPd). The SAF layer 113 may include an anti-ferromagnetic metal, such as ruthenium (Ru). The pinned layer 114 may include a cobalt iron (CoFe) based material. For example, the pinned layer 114 may include cobalt iron boron (CoFeB). In other embodiments, the pinned layer 114 may include a CoFeB/Ta/CoFeB multilayer. In still other embodiments, the pinned layer 114 may include a Co/B/CoFeB multilayer or a Co/W/CoFeB/W/CoFeB multilayer.

The tunneling barrier layer 120 may include magnesium oxide (MgO). For example, the tunneling barrier layer 120 may be formed by depositing magnesium (Mg) on the pinned layer 114, and oxidizing the deposited magnesium (Mg).

The free magnetic layer (free layer) 130 may include one of a CoFe layer, a CoFeB layer, a CoFe/CoFeB multilayer, a CoFeB/W/CoFeB multilayer, and a CoFe/W/CoFeB multilayer. For example, a lower portion of the free layer 130 may include a CoFe layer containing a very low concentration of boron (B) or a substantially boron-free CoFe layer, and an upper portion of the free layer 130 may include a CoFeB layer. That is, a concentration of boron in the upper portion of the free layer 130 may be different from a concentration of boron in the lower portion of the free layer 130. For example, the lower portion of the free layer 130 may have a relatively low concentration of boron (B), and the upper portion of the free layer 130 may have a relatively high concentration of boron (B). In some embodiments, the lower portion of the free layer 130 may be a substantially boron-free region. In other embodiments, the lower portion of the free layer 130 may have a relatively high concentration of boron (B), and the upper portion of the free layer 130 may have a relatively low concentration of boron (B). In some embodiments, the upper portion of the free layer 130 may be a substantially boron-free region. Additionally, a free layer 130 having low concentration of boron (B) may have a crystallized state, and a free layer 130 having high concentration of boron (B) may have an amorphous state.

The oxide layer 140 may include tantalum oxide (TaO), zirconium oxide (ZrO), titanium oxide (TiO), vanadium oxide (VO), yttrium oxide (YO), scandium oxide (ScO), molybdenum oxide (MoO) and/or magnesium oxide (MgO). In some embodiments, the oxide layer 140 may include a borated oxide. For example, the oxide layer 140 may include tantalum boron oxide (TaBO), zirconium boron oxide (ZrBO), titanium boron oxide (TiBO), vanadium boron oxide (VBO), yttrium boron oxide (YBO), scandium boron oxide (ScBO), molybdenum boron oxide (MoBO), magnesium boron oxide (MgBO), cobalt boron oxide (CoBO), cobalt iron boron oxide ((CoFe)BO), or other various metal boron oxides. For example, the oxide layer 140 may include a metal having a lower boride-forming energy than that of cobalt (Co) and/or iron (Fe).

The capping layer 150 may include a metal, such as tantalum (Ta) or ruthenium (Ru).

The hardmask 160 may include a metal such as tungsten (W), an alloy and/or a metal compound.

The MRAM 200A may further include a liner 170 surrounding side surfaces of the magnetoresistive cell 100A. The liner 170 may also be conformally formed on the intermediate interlayer insulating layer 32. The liner 170 may include a metal oxide, such as aluminum oxide ($Al_2O_3$) or silicon nitride (SiN).

The MRAM 200A may further include an upper interlayer insulating layer 33 surrounding the magnetoresistive cell 100A. The upper interlayer insulating layer 33 may include silicon oxide ($SiO_2$).

The upper electrode 60 may be in contact with upper and side surfaces of the hardmask 160 by passing in a substantially vertical direction through the upper interlayer insulating layer 33 and an upper portion of a side surface of the capping layer 150. The upper electrode 60 may include an upper electrode barrier layer 61 and an upper electrode plug 65. The upper electrode barrier layer 61 may include titanium (Ti), tantalum (Ta), titanium nitride (TiN), tantalum nitride (TaN) and/or another barrier metal or metal compound. The upper electrode plug 65 may include a metal, such as tungsten (W) or copper (Cu).

The bit line 70 may be disposed to be in contact with the upper electrode 60 on the upper interlayer insulating layer 33. The bit line 70 may extend substantially horizontally. The bit line 70 may include a bit line barrier layer 71 in direct contact with the upper electrode 60, and a bit line interconnection 75 disposed on the bit line barrier layer 71. The bit line barrier layer 71 may include titanium (Ti), tantalum (Ta), titanium nitride (TiN), tantalum nitride (TaN) and/or another barrier metal or metal compound. The bit line interconnection 75 may include a metal, such as tungsten (W) or copper (Cu).

Referring to FIG. 2B, the MRAM 200B in accordance with an embodiment disclosed herein may include a magnetoresistive cell 100B in which the hardmask 160 is omitted as compared to the MRAM 200A illustrated in FIG. 2A.

Figure 3A:
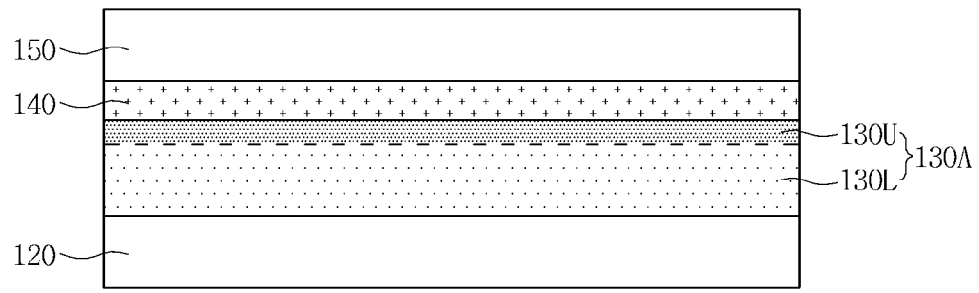
FIGS. 3A and 3B are vertical cross-sectional views conceptually illustrating free layers 130A and 130B with regard to the concentration of boron (B) in accordance with various embodiments disclosed herein.
Figure 3B:
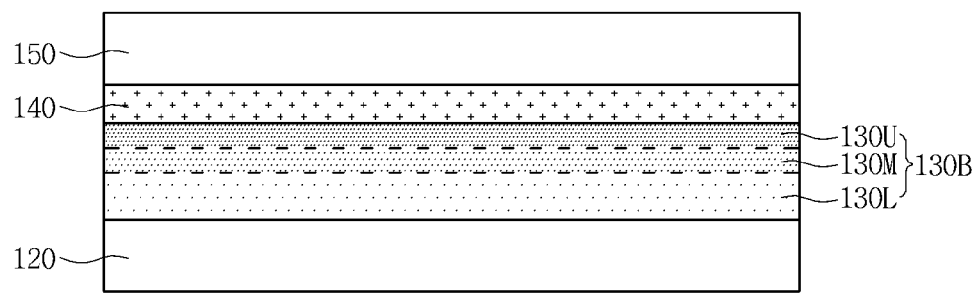

FIGS. 3A and 3B respectively depict vertical cross-sectional views conceptually illustrating free layers 130A and 130B with respect to a concentration of boron (B) in accordance with various embodiments disclosed herein. The free layers 130A and 130B may correspond to the free layers 130 depicted in FIGS. 2A and 2B.

Referring to FIG. 3A, the free layer 130A in accordance with an embodiment disclosed herein may include a lower free layer 130L having a relatively low concentration of boron (B) and an upper free layer 130U having a relatively high concentration of boron (B). The lower free layer 130L may be thicker (in a vertical direction in FIG. 3A) than the upper free layer 130U. The lower free layer 130L may be a substantially boron-free layer. For example, the lower free layer 130L may include a CoFe layer, whereas the upper free layer 130U may include a CoFeB layer.

Referring to FIG. 3B, the free layer 130B in accordance with an embodiment disclosed herein may include a multi-layer of free layers 130L, 130M and 130U. For example, the free layer 130B may include a lower free layer 130L, an intermediate free layer 130M and an upper free layer 130U. A concentration of boron (B) in the lower free layer 130L may be relatively low, a concentration of boron (B) in the upper free layer 130U may be relatively high, and a concentration of boron (B) in the intermediate free layer 130M may be between the concentration of boron (B) in the lower free layer 130L and the concentration of boron (B) in the upper free layer 130U. In one embodiment, the lower free layer 130L may be a substantially boron-free layer. In some embodiments, the free layer 130B may be formed by more layers each having different concentrations of boron (B) than depicted in FIG. 3B.

Referring again to FIGS. 3A and 3B, the free layers 130A and 130B in accordance with various embodiments disclosed herein may have concentrations of boron (B) that gradually or continuous increase through the free layers 130A and 130B. For example, the dashed boundary lines depicted between the lower free layer 130L, the intermediate free layer 130M and the upper free layer 130U may be hypothetical. The embodiments disclosed herein that are described with reference to FIGS. 3A and 3B, show that the free layers 130A and 130B may have different characteristics according to different concentrations of boron (B). In some embodiments, the free layers 130A and 130B may each be formed in to have more layers than depicted in FIGS. 3A and 3B.

Figure 4A:
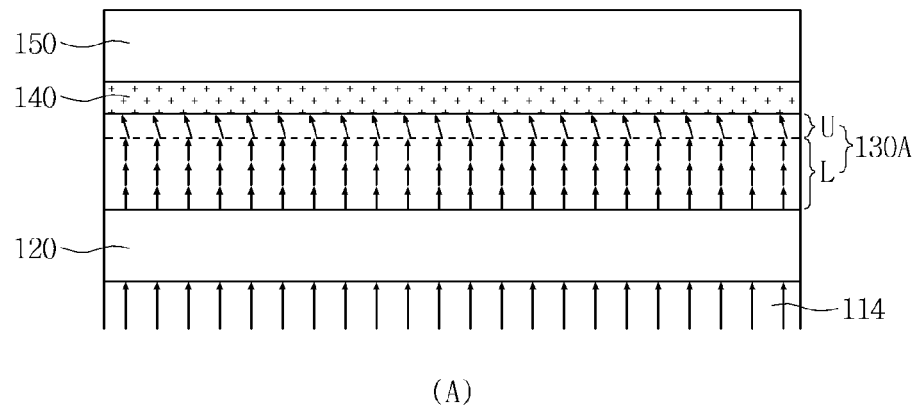
FIGS. 4A and 4B conceptually illustrate magnetization directions of the free layers 130A and 130B of magnetoresistive cells 100A and 100B in accordance with various embodiments disclosed herein.
Figure 4A:
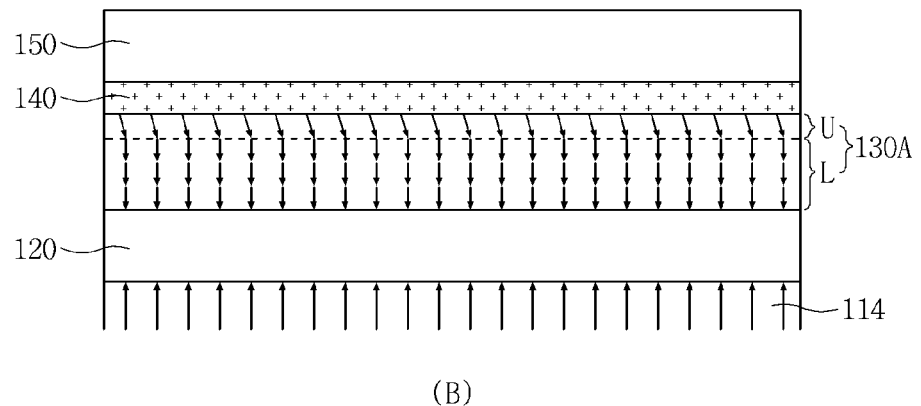
Figure 4B:
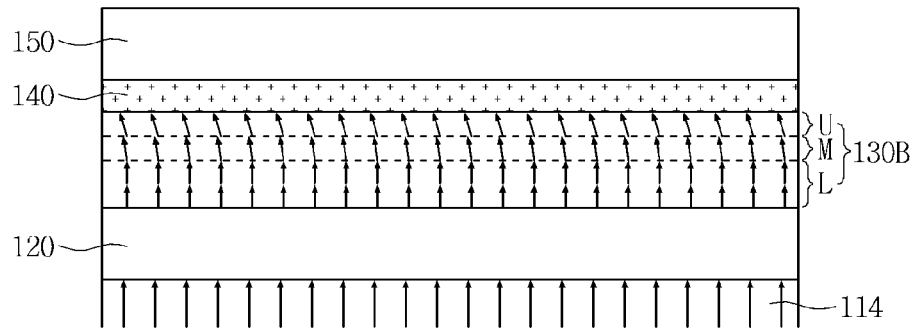
Figure 4B:
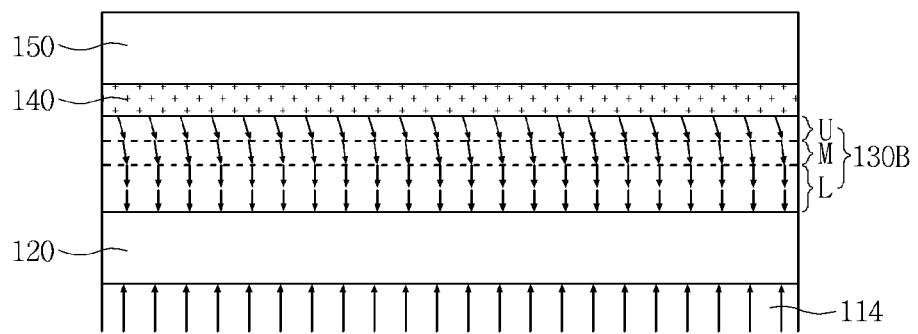

FIGS. 4A and 4B respectively depict conceptual magnetization directions of the respective areas, or layers, forming free layers 130A and 130B of magnetoresistive cells 100A and 100B in accordance with various embodiments disclosed herein. A magnetization direction of each area, or layer, of the free layers 130A and 130B may be conceptually depicted using arrows, as shown in FIGS. 4A and 4B. According to the embodiments disclosed herein, a magnetization direction of the pinned layer 114 is considered to be vertical or substantially vertical.

Referring to FIG. 4A, the free layer 130A of the magnetoresistive cell 100A in accordance with an embodiment disclosed herein may include a lower portion L having a vertical magnetization direction and an upper portion U having a magnetization direction that is oblique, or inclined, to a vertical magnetization direction. For example, the lower portion L and the upper portion U of FIG. 4A may respectively correspond to the lower free layer 130L and the upper free layer 130U of FIG. 3A. Based on the concentration of boron (B), the magnetization directions of the respective layers of the free layer 130A may be different. More specifically, as the concentration of boron (B) decreases, the magnetization direction may become vertically oriented, and as the concentration of boron (B) increases, the magnetization direction may become more inclined with respect to the vertical (i.e., tending to become horizontally oriented). That is, as the concentration of boron (B) decreases, the direction of magnetization of a layer may become oriented in a substantially vertical direction (i.e., in a direction that is substantially parallel to a direction from bottom to top in FIG. 4A), and as the concentration of boron (B) increases, the direction of magnetization may become more inclined with respect to the vertical direction (i.e., in a direction that is tending to become more horizontal and more parallel to a direction from right to left in FIG. 4A) Accordingly, the lower portion L may be a region including a relatively low concentration of boron (B), and the upper portion U may be a region including a relatively high concentration of boron (B). For example, the lower portion L may be a substantially boron-free region, and the upper portion U may comprise a relatively high concentration of boron (B). In one embodiment, the lower portion L may include a CoFe layer, and the upper portion U may include a CoFeB layer. In other words, the lower portion L may be a relatively more crystallized region, whereas the upper portion U may be a relatively less crystallized region.

In FIG. 4A(A), the magnetization directions of the layers forming the free layer 130A are conceptually depicted for the situation in which the free layer 130A is in a low-resistance state. In FIG. 4A(B), the magnetization directions of the layers forming the free layer 130A are conceptually depicted for the situation in which the free layer 130A is in a high resistance state. Referring to FIG. 4A(A), if the magnetization directions of the layers forming the free layer 130A are the same as the magnetization direction of the pinned layer 114, the free layer 130A may be in a low-resistance state. Referring to FIG. 4A(B), if the magnetization directions of the layers forming the free layer 130A are opposite to the magnetization direction of the pinned layer 114, the free layer 130A may be in a high-resistance state. Accordingly, depending on the magnetization direction of the free layer 130A with respect to the magnetization direction of the pinned layer 114, the magnetoresistive cell 100A may have a logic "1" state or a logic "0" state.

As the magnetization direction of a layer forming the free layer 130A becomes vertical, the magnetization direction of that layer may be hard to change. For example, when the magnetization direction of the lower portion L of the free layer 130A is vertical, retention characteristics of the lower portion L of the free layer 130A may be improved. As the magnetization direction of a layer forming the free layer 130A become more horizontal, damping characteristics, that is, switching characteristics, of the free layer 130A may be improved, or made easier. That is, as the magnetization direction of a layer forming the free layer 130A become horizontal, the magnetization direction of the layer may more easily change. For example, the magnetization direction of the upper portion U of the free layer 130A, which has a relatively higher concentration of boron (B), may be easily switched, or changed, by a relatively small current.

Accordingly, the free layer 130A of the magnetoresistive cell 100A in accordance with an embodiment disclosed herein may have two magnetization directions in which each layer of the free layer 130A comprises correspondingly different concentrations of boron (B). Accordingly, retention characteristics or switching characteristics may be excellent in comparison to the case in which a free layer of a magnetoresistive cell has a single (horizontal) magnetization direction. If the free layer 130A has only one magnetization direction, switching characteristics may be poor if retention characteristics are good or, on the other hand, retention characteristics may be poor if switching characteristics are good. Thus, if all of the magnetization directions of the free layer 130A are oblique with respect to a vertical direction (i.e., tending toward horizontal), the switching characteristics may be good, but the retention characteristics may be poor because the collective magnetization directions of the layers forming the free layer 130A are easily changed by a small current. Additionally, if all of the magnetization directions of the layers forming the free layer 130A are vertical, the retention characteristics may be good, but the switching characteristics may be poor because the collective magnetization directions of the layers forming the free layer 130A are hard to change. Accordingly, the free layer 130A in accordance with an embodiment disclosed herein may have superior retention characteristics in comparison to a free layer that has magnetization directions that are all in a direction that is oblique to a vertical direction, and may have superior switching characteristics in comparison to a free layer that has magnetization directions that are all in a vertical direction.

Referring to FIG. 4B, the free layer 130B of the magnetoresistive cell 100B in accordance with an embodiment disclosed herein may include a lower portion L having a vertical magnetization direction, an intermediate portion M having a slightly inclined magnetization direction, and an upper portion U having a heavily inclined magnetization direction. For example, the lower portion L, the intermediate portion M, and the upper portion U may respectively correspond to the lower free layer 130L, the intermediate free layer 130M, and the upper free layer 130U depicted in FIG. 3B. In FIG. 4B(A), the magnetization directions of the layers forming the free layer 130B are conceptually depicted for a situation in which the free layer 130B is in a low-resistance. In FIG. 4B(B), the magnetization directions of the layers forming the free layer 130B are conceptually depicted for a situation in which the free layer 130B is in a high-resistance state. Based on differences in the concentration of boron (B), the magnetization directions of the layers forming the free layer 130B may be different. More specifically, the lower portion L, which has a relatively low concentration of boron (B) (for example, a substantially boron-free region), may have a vertical magnetization direction. The intermediate portion M, which has an intermediate concentration of boron (B), may have a slightly inclined magnetization direction. The upper portion U, which has a relatively high concentration of boron (B), may have a more significant inclined magnetization direction than the inclination of the magnetization direction of the intermediate portion M.

The embodiments disclosed herein that are described with reference to FIGS. 4A and 4B, show that the magnetization directions of the free layers 130A and 130B may be set based on different concentrations of boron (B).

Figure 5A:
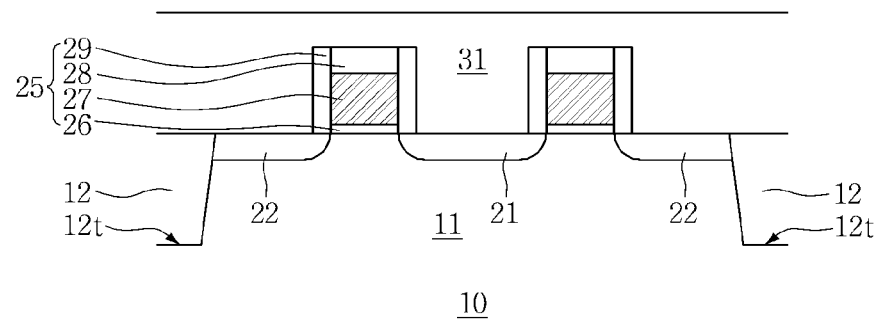
FIGS. 5A to 5P are vertical cross-sectional views for schematically describing a method of fabricating an MRAM in accordance with the subject matter disclosed herein.
Figure 5B:
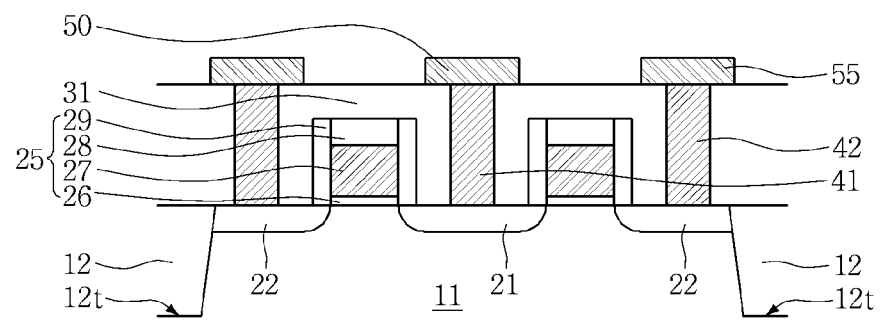
Figure 5C:
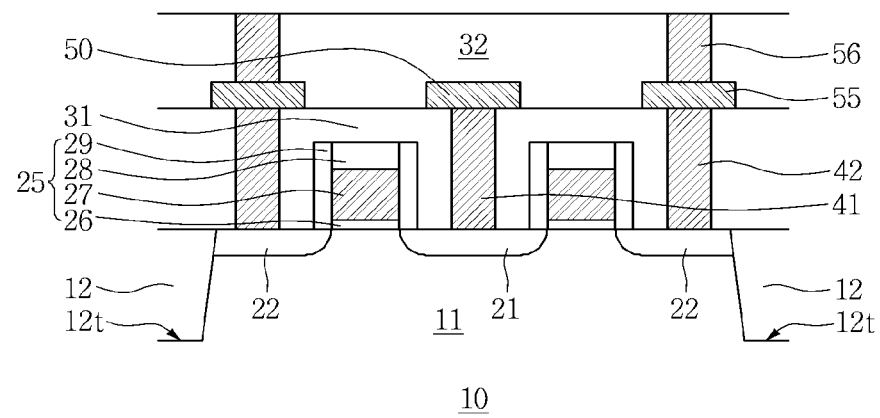
Figure 5D:
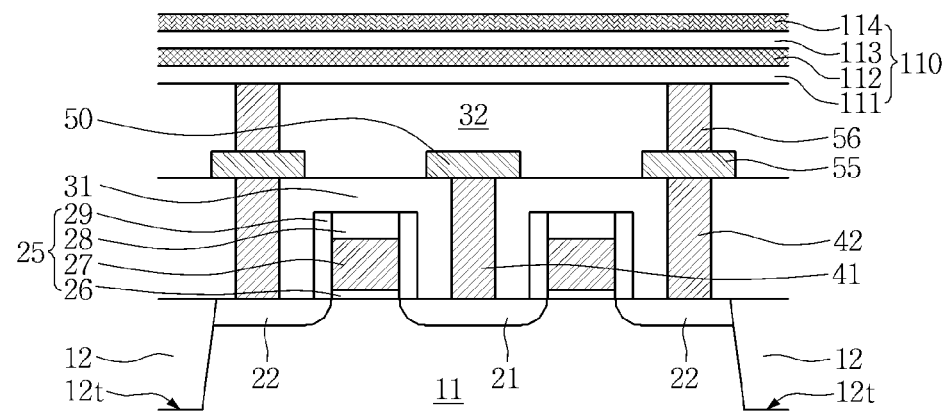
Figure 5E:
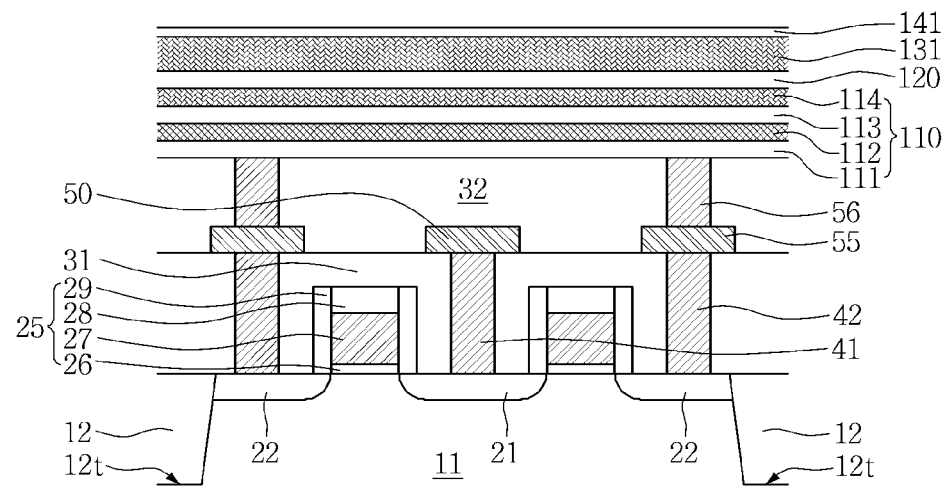
Figure 5F:
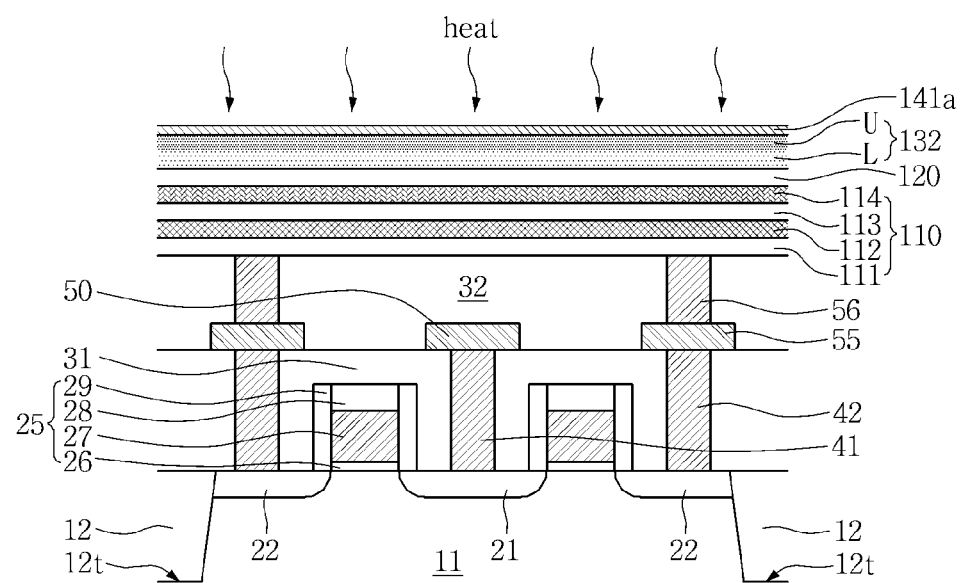
Figure 5G:
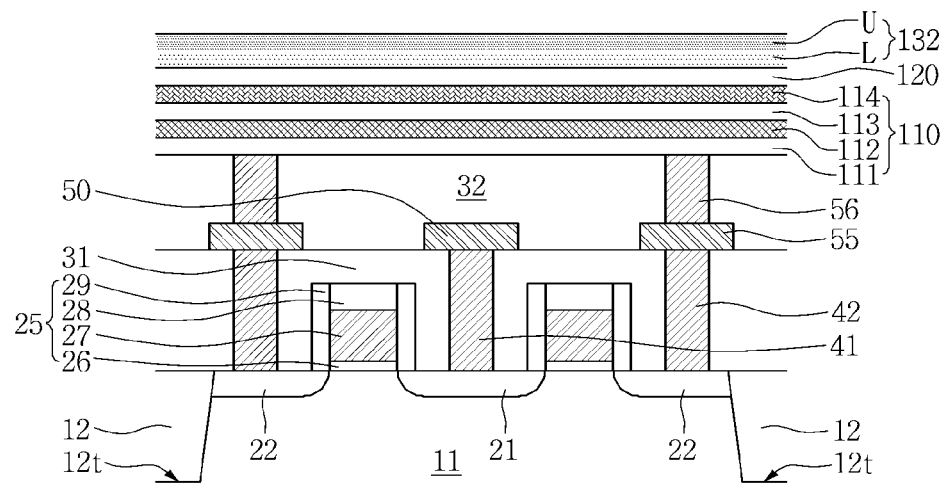
Figure 5H:
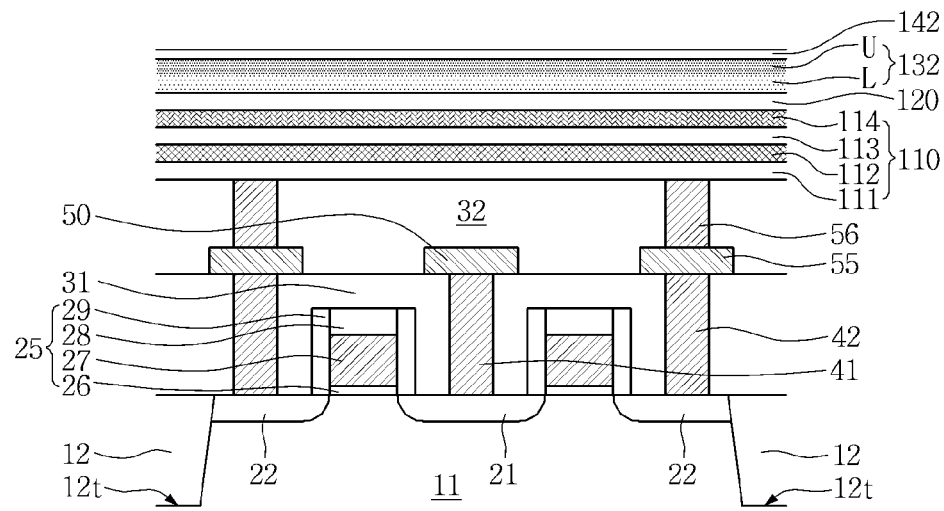
Figure 5I:
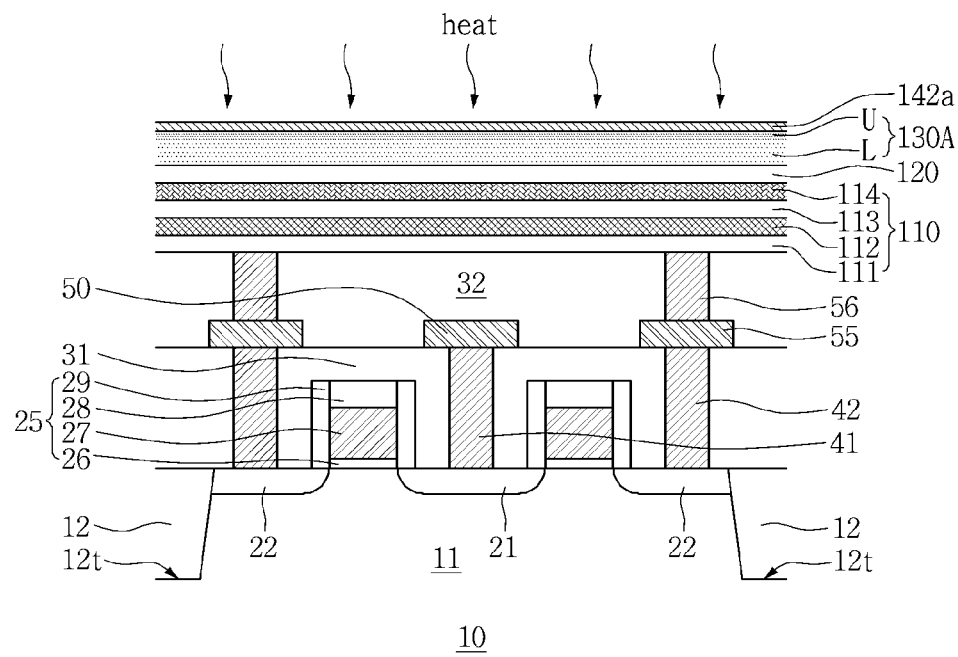
Figure 5J:
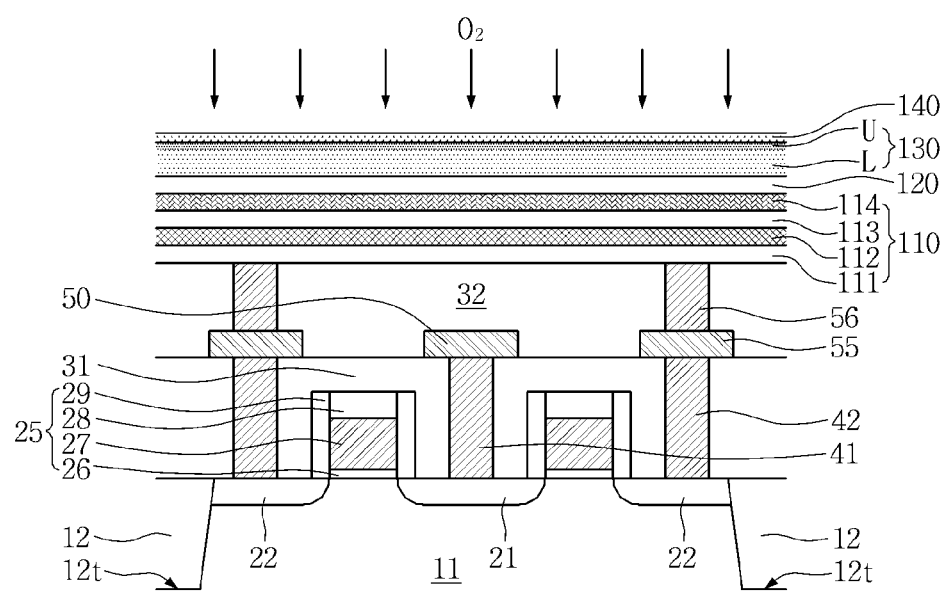
Figure 5K:
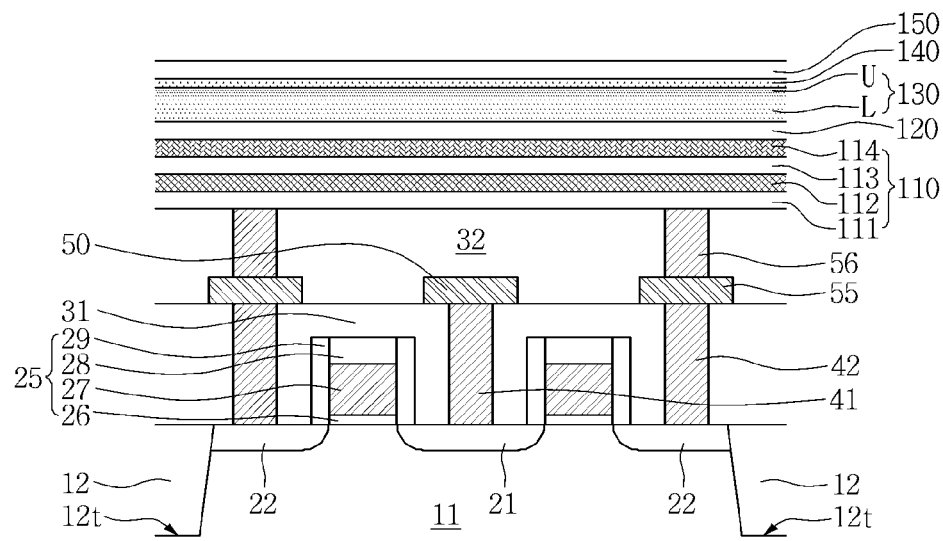
Figure 5L:
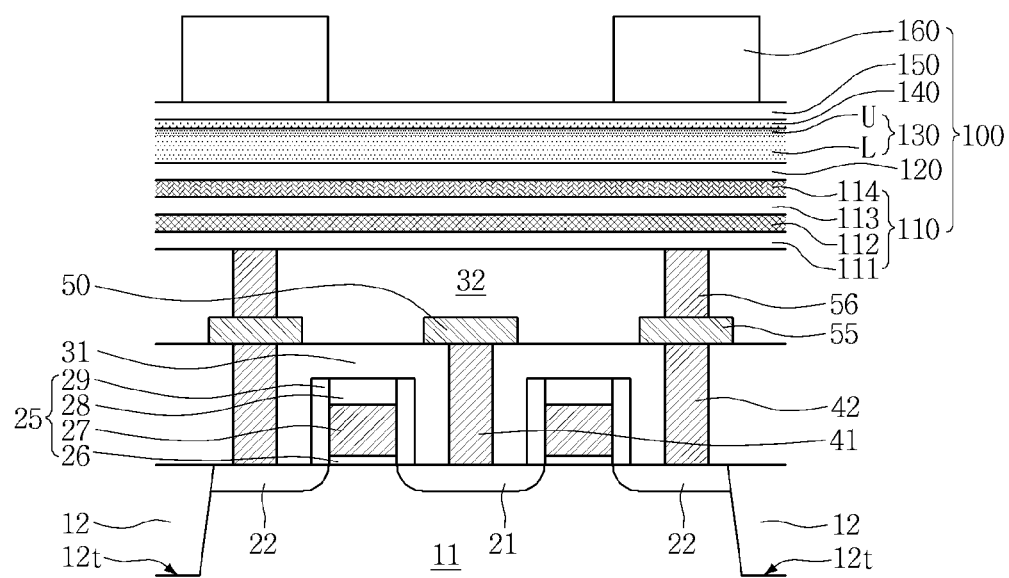
Figure 5M:
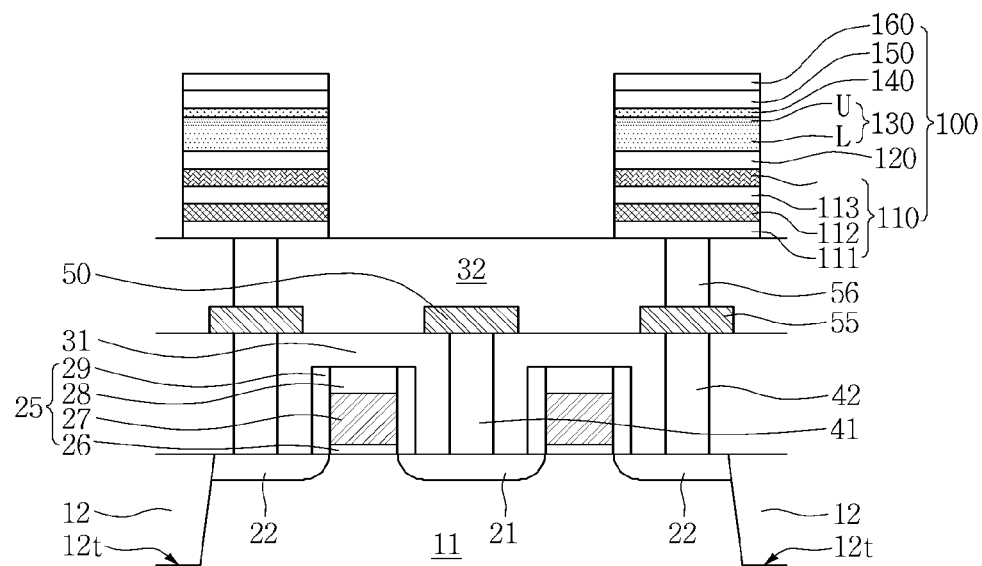
Figure 5N:
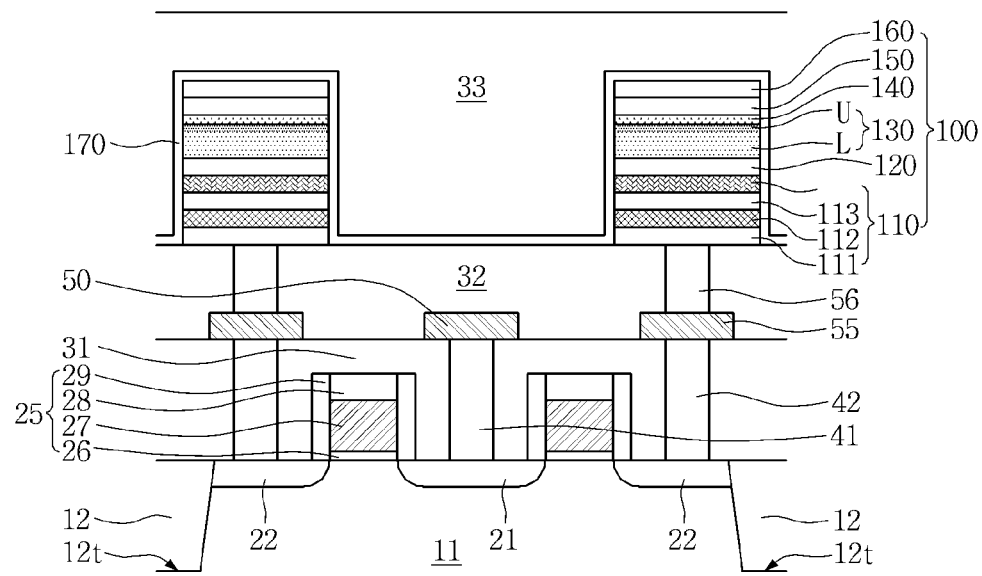
Figure 5O:
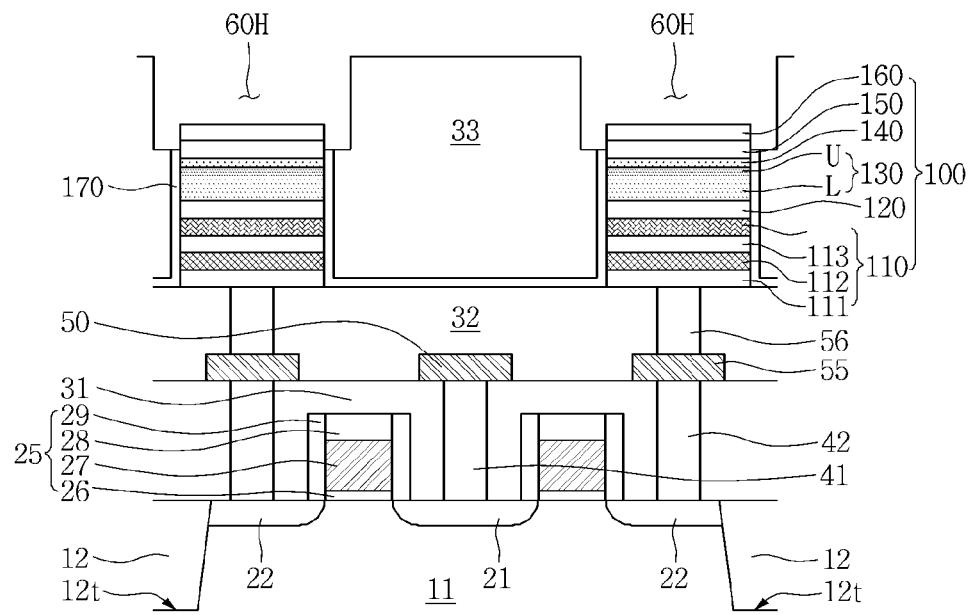
Figure 5P:
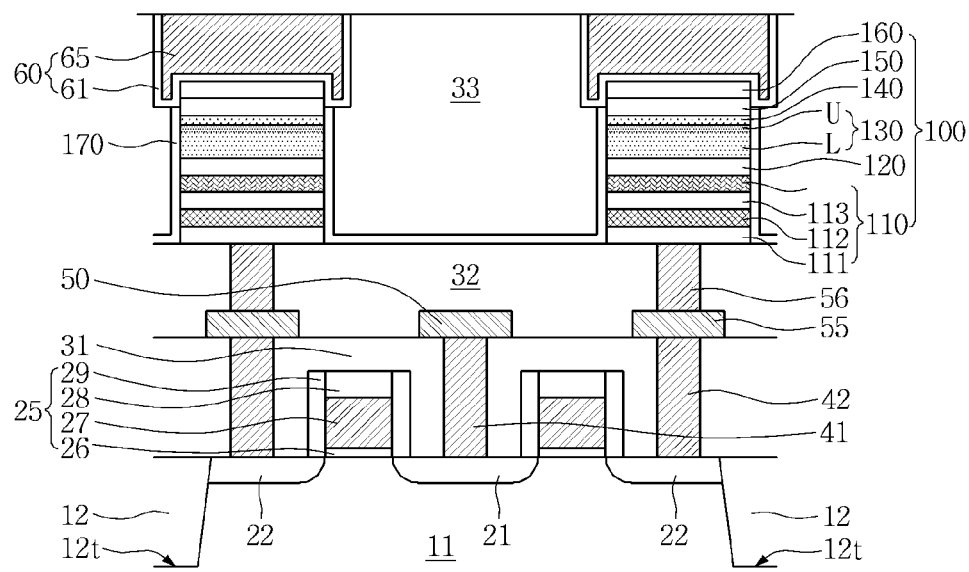
Figure 6:
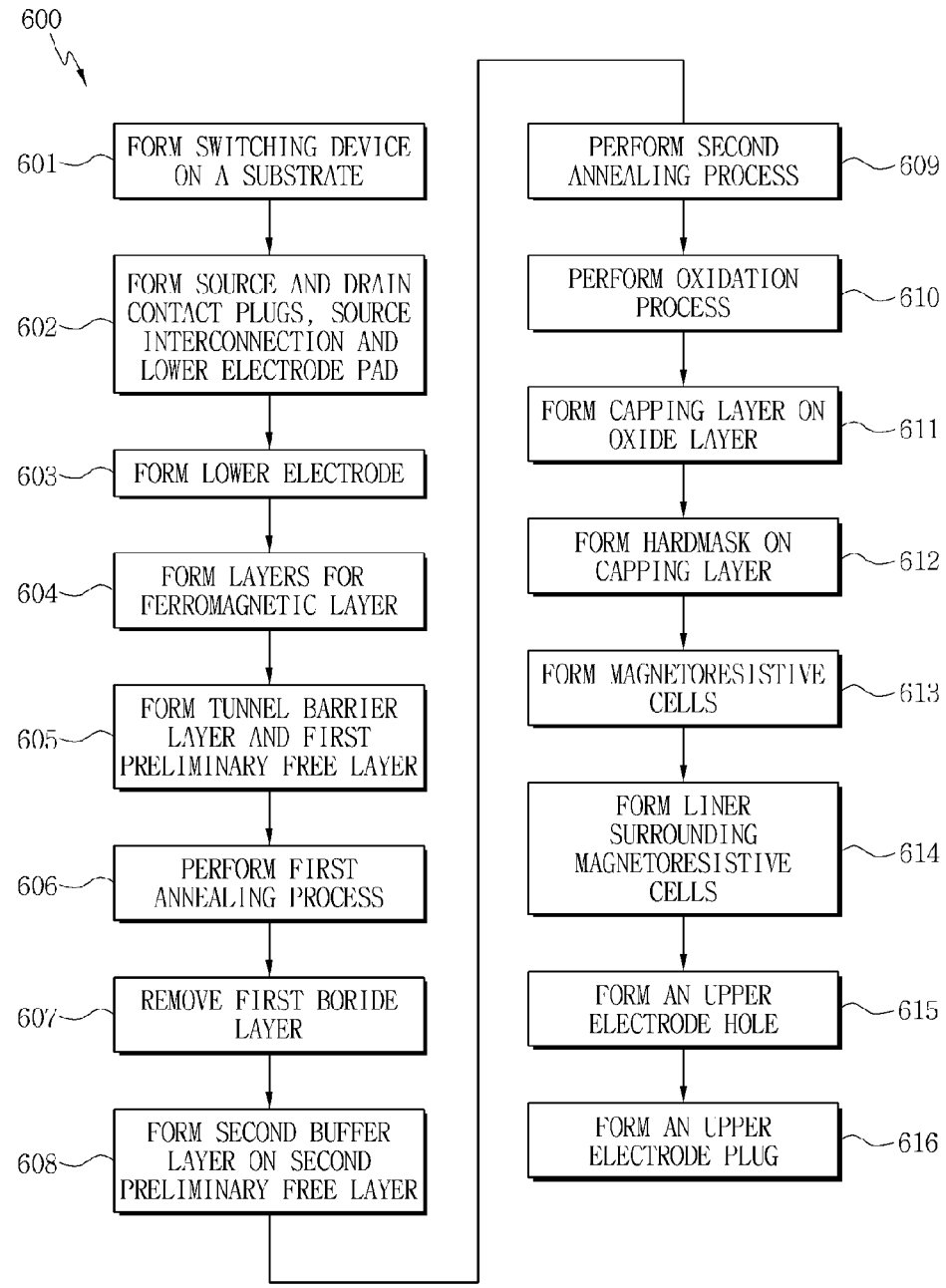
FIG. 6 shows a flow diagram for a process 600 of fabricating an MRAM in accordance with the subject matter disclosed herein.
Figure 7:
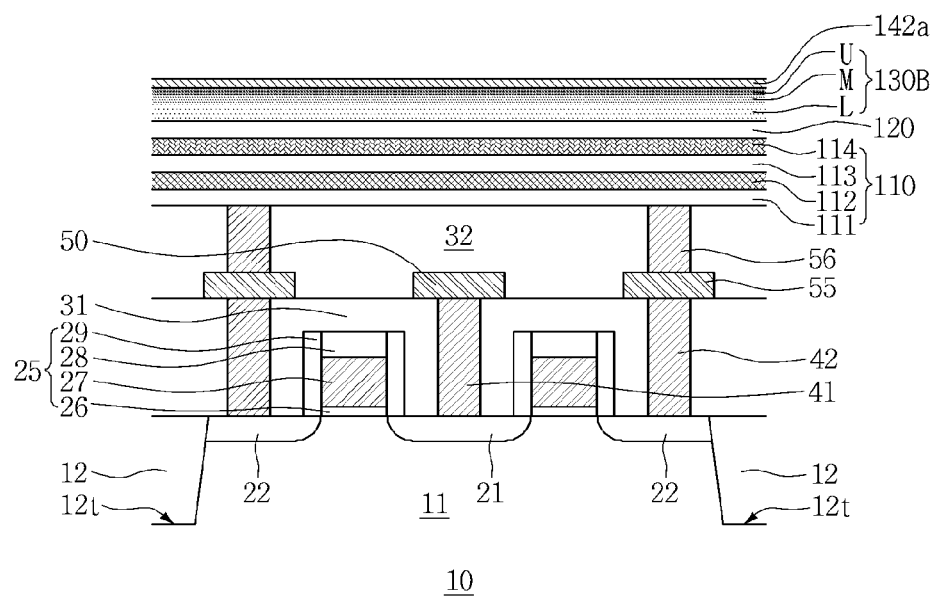
FIG. 7 illustrates a method of fabricating an MRAM in accordance with an extended embodiment disclosed herein.

FIGS. 5A to 5P are vertical cross-sectional views for schematically describing a method of fabricating an MRAM in accordance with an embodiment of the subject matter disclosed herein. FIG. 6 shows a flow diagram for a process 600 of fabricating an MRAM in accordance with the subject matter disclosed herein. At operation 601, a switching device Sw may be formed on a substrate 10. Referring to FIG. 5A, the method of fabricating the MRAM in accordance with an embodiment disclosed herein may include forming an isolation region 12 defining an active region 11 on a substrate 10 using well-known techniques. A gate structure 25 is formed on the active region 11 using well-known techniques. A source area 21 and a drain area 22 are formed using well-known techniques in the active region 11 at both sides of the gate structure 25. A lower interlayer insulating layer 31 covering the gate structure 25 is formed using well-known techniques. The substrate 10 may include a silicon wafer, a silicon-on-insulator (SOI) wafer or a semiconductor wafer having an epitaxial growth layer such as SiGe. The isolation region 12 may include an insulating material, such as silicon oxide and/or silicon nitride, that fills a trench 12t. The gate structure 25 may include a gate insulating layer 26 directly formed on the substrate 10 using well-known techniques. A gate electrode 27 may be formed on the gate insulating layer 26 using well-known techniques. A gate capping layer 28 is formed on the gate electrode 27 using well-known techniques. Gate spacers 29 are formed using well-known techniques on side surfaces of the gate insulating layer 26, the gate electrode 27 and the gate capping layer 28. The gate insulating layer 26 may include oxidized silicon and/or a metal oxide. The gate electrode 27 may include a conductive material, such as polysilicon, a metal, a metal alloy and/or a metal silicide. The gate capping layer 28 and the gate spacers 29 may include silicon nitride, silicon oxynitride and/or silicon oxide. The source area 21 and the drain area 22 may be formed using well-known techniques adjacent to both sides of the gate structure 25. The source area 21 and the drain area 22 may include a dopant, such as boron (B), phosphorous (P), and/or arsenic (As). A lower interlayer insulating layer 31 may be formed using well-known techniques on the gate structure 25, the source area 21 and the drain area 22. The lower interlayer insulation layer 31 may include silicon oxide, such as tetraethylorthosilicate (TEOS) or high density plasma (HDP) oxide.

At operation 602 in FIG. 6, source and drain contact plugs 41 and 42, a source interconnection 50 and a lower electrode pad 55 may be formed. Referring to FIG. 5B, the method may further include forming a source contact plug 41 in contact with the source area 21 by passing vertically through the lower interlayer insulating layer 31 using well-known techniques. A drain contact plug 42 may be formed in contact with the drain area 22 by passing vertically the lower interlayer insulating layer 31 using well-known techniques. A source interconnection 50 may be formed on the source contact plug 41 using well-known techniques. A lower electrode pad 55 may be formed on the drain contact plug 42 using well-known techniques. The source contact plug 41 and the drain contact plug 42 may include a conductive material, such as polysilicon, a metal, a metal alloy and/or a metal silicide. The method may include performing a planarization process, such as chemical mechanical polishing (CMP), until upper surfaces of the lower interlayer insulating layer 31, the source contact plug 41, and the drain contact plug 42 are coplanar or substantially coplanar. The source interconnection 50 and the lower electrode pad 55 may include a conductive material, such as polysilicon, a metal, a metal alloy and/or a metal silicide. The source interconnection 50 may have a horizontally-extending line shape (i.e., in a direction substantially parallel to a direction into FIG. 5B. The lower electrode pad 55 may have a circular or polygonal shape in a top view.

At operation 603 in FIG. 6, a lower electrode 56 may be formed. Referring to FIG. 5C, the method may include forming an intermediate interlayer insulating layer 32 covering the source interconnection 50 and the lower electrode pad 55 using well-known techniques. A lower electrode 56 may be formed using well-known techniques that is electrically connected to the lower electrode pad 55 by passing through the intermediate interlayer insulating layer 32 in substantially a vertical direction. The intermediate interlayer insulating layer 32 may include an insulating material, for example, silicon oxide such as TEOS or HDP oxide. The lower electrode 56 may include a conductive material, such as polysilicon, a metal, a metal alloy and/or a metal silicide. The method may include performing a planarization process, such as CMP, until upper surfaces of the intermediate interlayer insulating layer 32 and the lower electrode 56 are coplanar or substantially coplanar.

At operation 604 in FIG. 6, layers for a ferromagnetic layer 110 may be formed. Referring to FIG. 5D, the method may include forming a ferromagnetic layer 110 on the lower electrode 56 and the intermediate interlayer insulating layer 32 using well-known techniques. The formation of the ferromagnetic layer 110 may include using well-known techniques to form a seed layer 111, a pinning layer 112 on the seed layer 111, an SAF layer 113 on the pinning layer 112, and a pinned layer 114 on the SAF layer 113. The seed layer 111 may include a tantalum (Ta) layer and/or ruthenium (Ru) layer. The seed layer 111, for example, may be formed in a single layer that includes tantalum (Ta) or ruthenium (Ru), or a double layer that includes a lower tantalum (Ta) layer and an upper ruthenium (Ru) layer disposed on the lower tantalum (Ta) layer. The pinning layer 112 may include a CoPt layer, a CoPd layer, an alloy layer of CoPt and CoPd, and/or a multilayer in which CoPt layers and CoPd layers are alternately stacked. The SAF layer 113 may include an anti-ferromagnetic metal, such as ruthenium (Ru). The pinned layer 114 may include a CoFe-based material. For example, the pinned layer 114 may include CoFeB. In other embodiments, the pinned layer 114 may include a CoFeB/Ta/CoFeB multilayer. In still other embodiments, the pinned layer 114 may include a Co/B/CoFeB multilayer or a Co/W/CoFeB/W/CoFeB multilayer. The formation of the seed layer 111, the pinning layer 112, the SAF layer 113, and the pinned layer 114 may include performing a well-known physical vapor deposition (PVD) process, such as sputtering. In other embodiments, the pinning layer 112 may be formed by a metallic organic chemical vapor deposition (MOCVD) process.

At operation 605 in FIG. 6, a tunnel barrier layer 120 and a first preliminary free layer 131 may be formed. Referring to FIG. 5E, the method may include forming a tunneling barrier layer 120 on the ferromagnetic layer 110, forming a first preliminary free layer 131 on the tunneling barrier layer 120, and forming a first buffer layer 141 on the first preliminary free layer 131 using well-known techniques. The tunneling barrier layer 120 may include magnesium oxide (MgO). More specifically, the tunneling barrier layer 120 may be formed by a magnesium (Mg) layer on the ferromagnetic layer 110 by performing a well-known deposition process, and oxidizing the magnesium (Mg) layer by performing a well-known oxidation process. The first preliminary free layer 131 may include a CoFeB single layer, or a CoFeB/W/CoFeB multilayer. The first preliminary free layer 131 may be formed by a well-known PVD process, such as sputtering. The first buffer layer 141 may include a material having a lower boride-forming energy than that of cobalt (Co) or iron (Fe). For example, the first buffer layer 141 may include any one of tantalum (Ta), hafnium (Hf), zirconium (Zr), titanium (Ti), vanadium (V), yttrium (Y), scandium (Sc), molybdenum (Mo), and magnesium (Mg). According to an embodiment, the first buffer layer 141 may include tantalum (Ta). The first buffer layer 141 may be formed to have a thickness (in a vertical direction in FIG. 5E) that is capable of adequately absorbing boron atoms in the first preliminary free layer 131. For example, the first buffer layer 141 may have a thickness of several atomic layers, that is, several Ångstroms or several tens of nanometers. In other embodiments, the first buffer layer 141 may be formed in such a manner that atoms forming the first buffer layer 141 are implanted or absorbed in the first preliminary free layer 131 or formed to have a single atomic layer.

At operation 606 in FIG. 6, a first annealing process may be performed. Referring to FIG. 5F, the method may include performing a first annealing process so that boron (B) in the first preliminary free layer 131 is absorbed and diffused into the first buffer layer 141. Accordingly, the first buffer layer 141 may transition into a first boride layer 141a, and the first preliminary free layer 131 may transition into a second preliminary free layer 132 having a lower concentration of boron (B) than the first preliminary free layer 131. The first boride layer 141a may include a material of the first buffer layer 141 and boron (B). For example, the first boride layer 141a may include tantalum boron (TaB), zirconium boron (ZrB), titanium boron (TiB), vanadium boron (VB), yttrium boron (YB), scandium boron (ScB), molybdenum boron (MoB), magnesium boron (MgB), cobalt boron (CoB), cobalt iron boron (CoFeB), or various other metal boride layers.

The boron (B) concentration in the second preliminary free layer 132 may be gradated. That is, the concentration of boron (B) in the second preliminary free layer 132 may change from a relatively low concentration in a lower portion and a relatively higher concentration in an upper portion. For example, a lower portion L of the second preliminary free layer 132 may have a relatively low concentration of boron (B), and an upper portion U of the second preliminary free layer 132 may have a relatively high concentration of boron (B). The first annealing process may include heating the first preliminary free layer 131 to about 250 to about 500° C. under an atmospheric pressure or a vacuum. The first annealing process may include a rapidly thermal anneal (RTA) process using a halogen lamp. The first annealing process may be performed for about 10 to about 600 seconds. As the temperature of annealing increases, the annealing time may correspondingly decrease, and as the temperature of annealing decreases, the annealing time may correspondingly increase. The first annealing process may be performed at a temperature that is lower than a melting point of the first buffer layer 141.

At operation 607 in FIG. 6, the first boride layer 141a may be removed. Referring to FIG. 5G, the method may include removing the first boride layer 141a by performing an etching process. The etching process may include a physical sputtering etching process using argon (Ar) or the like. Referring to FIGS. 5F and 5G, the process of forming the first buffer layer 141, the first annealing process, and the etching process may be performed repeatedly. For example, the method may include repeatedly performing the processes described with reference to FIGS. 5F and 5G until the concentration of boron (B) in the first preliminary free layer 131 is reduced to a desired level. As the processes are repeated, the concentration of boron (B) in the lower portion L of the first preliminary free layer 131 may be gradually reduced to near zero, and the concentration of boron (B) in the upper portion U of the first preliminary free layer 131 also may be gradually reduced while being maintained at a higher boron (B) concentration level than the concentration of boron (B) in the lower portion L of the first preliminary free layer 131.

At operation 608 in FIG. 6, a second buffer layer 142 may be formed on the second preliminary free layer 132. Referring to FIG. 5H, the method may include forming second buffer layer 142 on the second preliminary free layer 132. The first buffer layer 141 may include a material having a lower boride-forming energy than that of cobalt (Co) or iron (Fe). For example, the second buffer layer 142 may include the same material as the first buffer layer 141.

At operation 609 in FIG. 6, a second annealing process may be performed. Referring to FIG. 5I, the method may include performing a second annealing process that additionally diffuses boron (B) in the second preliminary free layer 132 into the second buffer layer 142. Accordingly, the second buffer layer 142 may transition into a second boride layer 142a, and the second preliminary free layer 132 may transition into a free layer 130. The second annealing process may be performed similar to the first annealing process. The second boride layer 142a may include the same material as the first boride layer 141a.

At operation 610, an oxidation process may be formed. Referring to FIG. 5J, the method may include performing an oxidation process to transition the second boride layer 142a into an oxide layer 140. The oxidation process may include naturally oxidizing the second boride layer 142a by appropriately flowing $O_2$ gas in a chamber at room temperature. When heating the second boride layer 142a or flowing oxide radicals (O*) in the chamber, the second boride layer 142a may be very rapidly oxidized. Accordingly, the oxidation process may include a natural oxidation process so that the second boride layer 142a is slowly oxidized. Additionally, in order to control an oxidation rate, an inert gas such as helium (He), neon (Ne), argon (Ar), or xenon (Xe), or a nitrogen ($N_2$) gas may flow into the chamber simultaneously with the oxygen ($O_2$) gas. The oxide layer 140 may include the materials in the first and second buffer layers 141 and 142 and an oxide. For example, the oxide layer 140 may include tantalum oxide (TaO), zirconium oxide (ZrO), titanium oxide (TiO), vanadium oxide (VO), yttrium oxide (YO), scandium oxide (ScO), molybdenum oxide (MoO), magnesium oxide (MgO), cobalt oxide (CoO), cobalt iron oxide (CoFeO), or other various metal oxides. In some embodiments, the oxide layer 140 may further include boron (B). For example, the oxide layer 140 may include tantalum boron oxide (TaBO), zirconium boron oxide (ZrBO), titanium boron oxide (TiBO), vanadium boron oxide (VBO), yttrium boron oxide (YBO), scandium boron oxide (ScBO), molybdenum boron oxide (MoBO), magnesium boron oxide (MgBO), cobalt boron oxide (CoBO), cobalt iron boron oxide ((CoFe)BO), or other various metal boron oxide.

At operation 611, a capping layer 150 may be formed on the oxide layer 140. Referring to FIG. 5K, the method may include forming a capping layer 150 on the oxide layer 140. The capping layer 150 may include a metal, such as tantalum (Ta). The capping layer 150 may be formed by performing a well-known PVD process, such as sputtering.

At operation 612, a hardmask 160 is formed on the capping layer 150. Referring to FIG. 5L, the method may include forming a hardmask 160 on the capping layer 150 using a well-known technique. The hardmask 160 may include tantalum (T), titanium (Ti), ruthenium (Ru), and/or another metal.

At operation 613, magnetoresistive cells 100 may be formed. Referring to FIG. 5M, the method may include using a well-known etching technique to form a magnetoresistive cell 100 by etching the capping layer 150, the free layer 130, the tunneling barrier layer 120, and the ferromagnetic layer 110 using the hardmask 160 as an etch mask. The hardmask 160 may remain on the capping layer 150. In other embodiments, the hardmask 160 may be removed.

At operation 614, a liner 170 may be formed surrounding the magnetoresistive cells 100. Referring to FIG. 5N, the method may include forming a liner 170 conformally surrounding the magnetoresistive cell 100 using a well-known technique. An upper interlayer insulating layer 33 may be formed covering the magnetoresistive cell 100 and the liner 170 using a well-known technique. The liner 170 may be conformally formed on upper and side surfaces of the magnetoresistive cell and an upper surface of the intermediate interlayer insulating layer 32. The liner 170 may include a metal oxide, such as aluminum oxide ($Al_2O_3$) or silicon nitride (SiN). The upper interlayer insulating layer 33 may include silicon oxide ($SiO_2$).

At operation 615, an upper electrode hole 60H may be formed. Referring to FIG. 5O, the method may include forming using a well-known technique an upper electrode hole 60H that exposes the hardmask 160 of the magnetoresistive cell 100 that passes substantially vertically through the upper interlayer insulating layer 33 and the liner 170. The upper electrode hole 60H may expose upper and side surfaces of the hardmask 160. The upper electrode hole 60H may partially expose a side surface of the capping layer 150. A diameter, or horizontal width, of the upper electrode hole 60H may be greater than a horizontal width or a horizontal length of an upper surface of the hardmask 160 of the magnetoresistive cell 100.

At operation 616, an upper electrode plug 65 may be formed. Referring to FIG. 5P, the method may include conformally forming an upper electrode barrier layer 61 on sidewalls of the upper electrode hole 60H and the upper surface of the hardmask 160 using a well-known technique. An upper electrode plug 65 may be formed using a well-known technique that fills the upper electrode hole 60H in the upper electrode barrier layer 61. The upper electrode barrier layer 61 may include titanium (Ti), tantalum (Ta), titanium nitride (TiN), tantalum nitride (TaN) or another barrier metal or metal compound. The upper electrode plug 65 may include a metal, such as tungsten (W) or copper (Cu).

Next, referring again to FIGS. 2A and 3A, the method may include forming a bit line 70 on the upper electrode 60 and the upper interlayer insulating layer 33 using a well-known technique. The formation of the bit line 70 may include conformally forming a bit line barrier layer 71 and forming a bit line interconnection 75 on the bit line barrier layer 71. The bit line barrier layer 71 may include titanium (Ti), tantalum (Ta), titanium nitride (TiN), tantalum nitride (TaN), or another barrier metal or metal compound. The bit line interconnection 75 may include a metal, such as tungsten (W) or copper (Cu).

FIG. 6 illustrates a method of fabricating an MRAM in accordance with another embodiment disclosed herein.

Referring to FIG. 6, the method of fabricating the MRAM in accordance with an embodiment disclosed herein may include forming the first buffer layer 141 on the first preliminary free layer 131 by performing the processes described with reference to FIGS. 5A to 5E. Additionally, boron (B) atoms may be diffused in the first and second preliminary free layers 131 and 132 into the first and second buffer layers 141 and 142 to form the free layer 130B, as depicted in FIG. 3B, by repeatedly performing the processes described with reference to FIGS. 5F to 5I. In an embodiment, a third buffer layer and a third preliminary free layer may temporarily be formed. Next, the method may include performing the processes described with reference to FIGS. 5J to 5P, and forming a bit line 70 on the upper electrode 60 and the upper interlayer insulating layer 33, referring again to FIGS. 2A and 3B.

Figure 8:
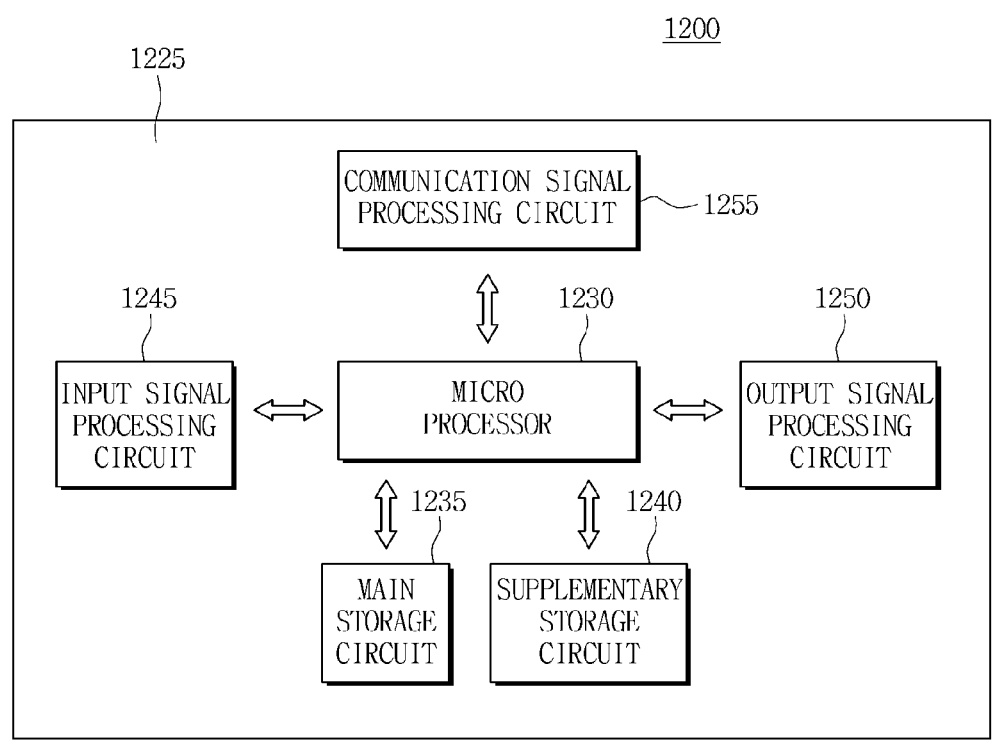
FIG. 8 is a block diagram schematically depicting components that may include one or more magnetoresistive cells formed according to the subject matter disclosed herein.

FIG. 8 is a block diagram schematically depicting components that may include one or more magnetoresistive cells formed according to the subject matter disclosed herein.

In detail, the electronic circuit board 1200 may include a microprocessor 1230 disposed on a circuit board 1225, a main storage circuit 1235 and a supplementary storage circuit 1240 that communicate with the microprocessor 1230, an input signal processing circuit 1245 that transfers a command to the microprocessor 1230, an output signal processing circuit 1250 that receives a command from the microprocessor 1230, and a communication signal processing unit 1255 that exchanges an electrical signal with other circuit boards. It may be understood that each of arrows refers to a path through an electrical signal is transferred.

The microprocessor 1230 may receive and process various electrical signals to output a result of the processing and may control the other elements of the electronic circuit board 1200. It may be understood that the microprocessor 1230 is, for example, a central processing unit (CPU) and a main control unit (MCU).

The main storage circuit 1235 may temporarily store data, which is always or frequently required by the microprocessor 1230, before-processing data, and after-processing data. The main storage circuit 1235 may need a fast response, and thus may be configured with a semiconductor memory chip.

In detail, the main storage circuit 1235 may be a semiconductor memory called a cache. The main storage circuit 1235 may be configured with static random access memory (SRAM), dynamic random access memory (DRAM), resistive random access memory (RRAM), a magnetoresistive random access memory (MRAM) and application semiconductor memories thereof (for example, a utilized RAM, a ferro-electric RAM, a fast cycle RAM, a phase changeable RAM, a magnetic RAM, and/or the like) or may be configured with other semiconductor memories. In one embodiment, the main storage circuit 1235 may include one or more magnetoresistive memory cells according to the subject matter disclosed herein.

Additionally, the main storage circuit 1235 may include a random access memory (RAM) irrespective of volatility/non-volatility capabilities. In the present embodiment, the main storage circuit 1235 may include one or more semiconductor chips, semiconductor packages, or semiconductor modules according to the exemplary embodiments. The supplementary storage circuit 1240 may be a large-capacity storage element and may be configured with a nonvolatile semiconductor memory, such as flash memory or the like, or a hard disk drive using a magnetic field. Alternatively, the supplementary storage circuit 1240 may be configured with a compact disk drive using light. Although the supplementary storage circuit 1240 does not need a fast speed in comparison with the main storage circuit 1235, the supplementary storage circuit 1240 may be applied to a case of needing to store large-scale data. The supplementary storage circuit 1240 may include a nonvolatile storage element irrespective of random/nonrandom capabilities. In one embodiment, the supplementary storage circuit 1240 may include one or more magnetoresistive memory cells according to the subject matter disclosed herein.

The input signal processing circuit 1245 may convert an external command into an electrical signal or may transfer an electrical signal, transferred from the outside, to the microprocessor 1230.

A command or an electrical signal transferred from the outside may be an operation command, an electrical signal that is to be processed, or data that are to be stored. The input signal processing circuit 1245 may be a terminal signal processing circuit that processes a signal transmitted from a keyboard, a mouse, a touch pad, an image recognition device, or various sensors, an image signal processing circuit that processes an image signal transferred from a scanner or a camera, various sensors, an input signal interface, or the like.

The output signal processing circuit 1250 may be an element for transmitting an electrical signal, generated through processing by the microprocessor 1230, to the outside. For example, the output signal processing circuit 1250 may be a graphic card, an image processor, an optical converter, a beam panel card, one of various functional interface circuits, or the like.

The communication circuit 1255 may be an element for directly exchanging an electrical signal with other electronic systems or other circuit boards without undergoing the input signal processing circuit 1245 or the output signal processing circuit 1250. For example, the communication circuit 1255 may include a modem, a LAN card, various interfaces, and/or the like of a personal computer (PC) system. The communication circuit 1255 may include one or more magnetoresistive memory cells according to the subject matter disclosed herein.

Figure 9:
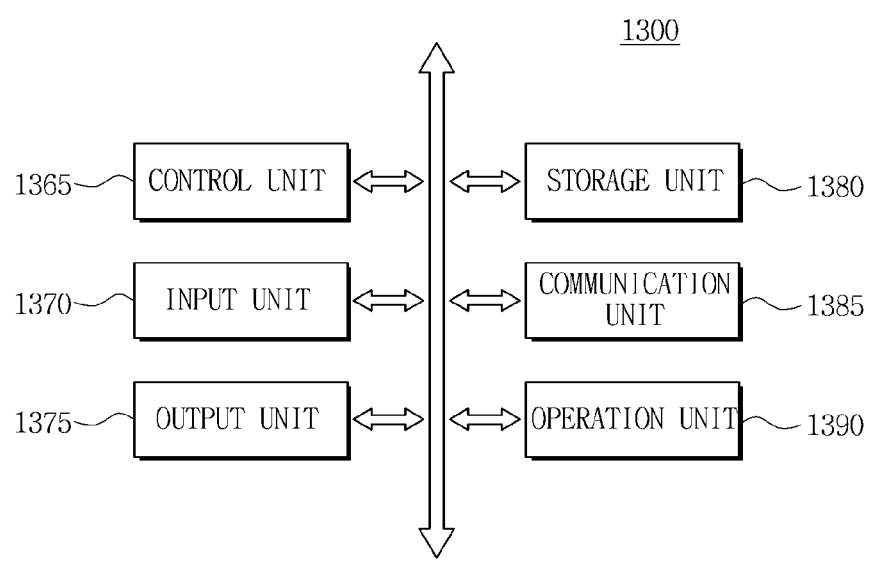
FIG. 9 is a block diagram schematically depicting an electronic system that includes one or more magnetoresistive memory cells according to the subject matter disclosed herein.

FIG. 9 is a block diagram schematically depicting an electronic system 1300 that includes one or more magnetoresistive memory cells according to the subject matter disclosed herein.

In detail, the electronic system 1300 according to an embodiment may include a control unit 1365, an input unit 1370, an output unit 1375, and a storage unit 1380. Also, the electronic system 1300 may further include a communication unit 1385 and/or an operation unit 1390.

The control unit 1365 may overall control the electronic system 1300 and elements. The control unit 1365 may be understood as a CPU or a central control unit, and may include the electronic circuit board 1200 (see FIG. 8). Also, the control unit 1365 may include a semiconductor device that may include one or more magnetoresistive memory cells according to the subject matter disclosed herein.

The input unit 1370 may transfer an electrical command signal to the control unit 1365. The input unit 1370 may be a keyboard, a keypad, a touch pad, an image recognizer such as a scanner, or various input sensors. The input unit 1370 may include one or more magnetoresistive memory cells according to the subject matter disclosed herein.

The output unit 1375 may receive the electrical command signal from the control unit 1365 to output a result of processing by the electronic system 1300. The output unit 1375 may be a monitor, a printer, a beam irradiator, or one of various mechanical devices. The output unit 1375 may include one or more magnetoresistive memory cells according to the subject matter disclosed herein.

The storage unit 1380 may be an element for temporarily or permanently storing an electrical signal, which is to be processed by the control unit 1165, and an electrical signal generated through processing by the control unit 1165. The storage unit 1380 may be physically or electrically connected or coupled to the control unit 1365. The storage unit 1380 may be a semiconductor memory, a magnetic storage device such as a hard disk or the like, an optical storage device such as a compact disk or the like, a server having a data storing function, or the like. Also, the storage unit 1380 may include one or more magnetoresistive memory cells according to the subject matter disclosed herein.

The communication unit 1385 may receive an electrical command signal from the control unit 1365 and may transfer the electrical command signal to another electronic system, or may receive an electrical command signal from the other electronic system. The communication unit 1385 may be a modem, a wired transmission/reception device, such as an LAN card, a wireless transmission/reception device such as a Wibro interface, an infrared port, or the like. Also, the communication unit 1385 may include one or more magnetoresistive memory cells according to the subject matter disclosed herein.

The operation unit 1390 may perform a physical or mechanical operation according to a command of the control unit 1365. For example, the operation unit 1390 may be an element, which performs a mechanical operation, such as a plotter, an indicator, an up/down operation, or the like. The electronic system 1300 according to an exemplary embodiment may include a computer, a network server, a networking printer, or a scanner, a wireless controller, a mobile communication terminal, an exchanger, an electronic device performs a programmed operation, and/or the like.

Moreover, the electronic system 1300 may be applied to mobile phones, MP3 players, navigation devices, portable multimedia players (PMPs), solid state disks (SSDs), household appliances, etc.

As set forth above, since a magnetoresistive cell and an MRAM in accordance with embodiments disclosed herein include an oxide layer containing boron (B) on a free layer, physical characteristics of the free layer may be maintained and/or improved.

Additionally, a method of forming a free layer, a magnetoresistive cell, and an MRAM in accordance with embodiments disclosed herein may include forming a preliminary free magnetic layer that includes boron (B), and forming a free layer magnetic layer by removing boron (B) from the preliminary free layer. Accordingly, the resulting free layer may include both a crystallized and substantially boron-free region, and an amorphous and boron-containing region.

Further, the method of forming a free layer, a magnetoresistive cell, and an MRAM in accordance with the embodiments disclosed herein may include forming a preliminary free magnetic layer that includes boron (B), forming a buffer layer absorbing boron (B) on the preliminary free magnetic layer, and forming an oxide layer by oxidizing the boron-absorbed buffer layer. Accordingly, the process of forming the free layer, the magnetoresistive cell, and an MRAM and the magnetoresistive cell formed thereby may have excellent characteristics.

The foregoing was for illustration of the embodiments only and is not to be construed as limiting thereof. Although a few embodiments have been described, those skilled in the art will readily appreciate that many modifications are possible without materially departing from the novel teachings and advantages.

What is claimed is:

1. A method of forming a magnetoresistive memory device, the method comprising:
   forming a ferromagnetic layer;
   forming a tunneling barrier layer on the ferromagnetic layer;
   forming a first preliminary free magnetic layer containing boron (B) on the tunneling barrier layer;
   forming a first buffer layer on the first preliminary free magnetic layer;
   performing a first annealing process to transition the first preliminary free magnetic layer to a second preliminary free magnetic layer and the first buffer layer to form a first boride layer;
   performing an etching process to remove the first boride layer;
   forming a second buffer layer on the second preliminary free magnetic layer;
   performing a second annealing process to transition the second preliminary free magnetic layer to form a free magnetic layer and the second buffer layer to form a second boride layer; and
   performing an oxidation process to transition the second boride layer to be an oxide layer.

2. The method of claim 1, wherein a concentration of boron (B) in the second preliminary free magnetic layer is less than a concentration of boron (B) in the first preliminary free magnetic layer.

3. The method of claim 1, wherein the first preliminary free magnetic layer includes cobalt iron boron (CoFeB).

4. The method of claim 1, wherein the free magnetic layer comprises:
   a first region having a relatively low concentration of boron (B), the first region being disposed in the free magnetic layer close to the tunneling barrier layer; and
   a second region having a relatively high concentration of boron (B), the second region being disposed in the free magnetic layer far from the tunneling barrier layer.

5. The method of claim 4, wherein the first region and the second region have a gradually gradated concentration of boron (B).

6. The method of claim 1, wherein the first buffer layer and the second buffer layer include a metal having a lower boride-forming energy that is than that of cobalt (Co) and iron (Fe).

7. The method of claim 6, wherein the first buffer layer includes any one of tantalum (Ta), hafnium (Hf), zirconium (Zr), titanium (Ti), vanadium (V), yttrium (Y), scandium (Sc), molybdenum (Mo) and magnesium (Mg).

8. The method of claim 6, wherein the second buffer layer includes any one of tantalum (Ta), hafnium (Hf), zirconium (Zr), titanium (Ti), vanadium (V), yttrium (Y), scandium (Sc), molybdenum (Mo) and magnesium (Mg).

9. The method of claim 1, wherein the oxide layer includes any one of tantalum oxide (TaO), zirconium oxide (ZrO), titanium oxide (TiO), vanadium oxide (VO), yttrium oxide (YO), scandium oxide (ScO), molybdenum oxide (MoO) and magnesium oxide (MgO).

10. The method of claim 1, wherein the oxide layer includes boron (B).

11. The method of claim 1, wherein forming the ferromagnetic layer comprises:
    forming a seed layer;
    forming a pinning layer on the seed layer;
    forming an anti-ferromagnetic layer on the pinning layer; and
    forming a pinned layer on the anti-ferromagnetic layer.

12. The method of claim 11, wherein the seed layer includes tantalum (Ta), ruthenium (Ru) or iridium (Ir).

13. The method of claim 11, wherein the pinning layer includes at least one of a cobalt platinum (CoPt) layer, a cobalt palladium (CoPd) layer, an alloy layer of cobalt platinum (CoPt) and cobalt palladium (CoPd), and a multilayer in which a cobalt platinum (CoPt) layer and a cobalt palladium (CoPd) layer are stacked.

14. The method of claim 11, wherein the anti-ferromagnetic layer includes ruthenium (Ru).

15. The method of claim 11, wherein the pinned layer includes CoFeB.

16. The method of claim 1, wherein the tunneling barrier layer includes magnesium oxide (MgO).

17. The method of claim 16, wherein forming the tunneling barrier layer comprises:
    forming a magnesium (Mg) layer; and
    oxidizing the magnesium (Mg) layer.

18. The method of claim 1, further comprising:
    forming a capping layer on the oxide layer; and
    forming a magnetoresistive cell by forming a hardmask on the capping layer.

19. A method of forming a magnetoresistive memory device, the method comprising:
    forming a ferromagnetic layer;
    forming a tunneling barrier layer on the ferromagnetic layer;
    forming a first preliminary free magnetic layer containing boron (B) on the tunneling barrier layer;
    forming a first buffer layer on the first preliminary free magnetic layer;
    performing a first annealing process to transition the first preliminary free magnetic layer to a second preliminary free magnetic layer and the first buffer layer to form a first boride layer;
    performing a first etching process to remove the first boride layer;

forming a second buffer layer on the second preliminary free magnetic layer;

performing a second annealing process to transition the second preliminary free magnetic layer to form a free magnetic layer and the second buffer layer to form a second boride layer;

performing a second etching process to remove the second boride layer; and forming an oxide layer on the free magnetic layer.

20. A method of forming a magnetoresistive memory device, the method comprising:

forming a ferromagnetic layer on a substrate, the ferromagnetic layer comprising a first surface and a second surface that is opposite the first surface of the ferromagnetic layer;

forming a tunnel barrier layer on the ferromagnetic layer, the tunnel barrier layer comprising a first surface and a second surface that is opposite the first surface of the tunnel barrier layer, the first surface of the tunnel barrier layer being proximate to the second surface of the ferromagnetic layer; and forming a free magnetic layer on the tunnel barrier layer after the forming of the tunnel barrier layer, the free magnetic layer comprising a first surface and a second surface that is opposite the first surface of the free magnetic layer, the first surface of the free magnetic layer being proximate to the second surface of the tunnel barrier layer, the free magnetic layer further comprising a first region that is proximate to the second surface of the tunnel barrier layer and a second region that is distal to the second surface of the tunnel barrier layer, and the first region comprising a concentration of boron that is less that a concentration of boron of the second region.

* * * * *